United States Patent
Dyer et al.

(10) Patent No.: US 7,750,429 B2
(45) Date of Patent: Jul. 6, 2010

(54) SELF-ALIGNED AND EXTENDED INTER-WELL ISOLATION STRUCTURE

(75) Inventors: Thomas W. Dyer, Pleasant Valley, NY (US); Zhijiong Luo, Carmel, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 11/748,521

(22) Filed: May 15, 2007

(65) Prior Publication Data
US 2008/0283962 A1   Nov. 20, 2008

(51) Int. Cl.
*H01L 29/78* (2006.01)
(52) U.S. Cl. ............... 257/506; 257/510; 257/513; 257/500; 257/501; 257/E21.545
(58) Field of Classification Search ............... 257/500, 257/501, 506, 510, 513, E21.545
See application file for complete search history.

(56) References Cited

U.S. PATENT DOCUMENTS

| | | | | |
|---|---|---|---|---|
| 4,495,025 A | * | 1/1985 | Haskell | 438/427 |
| 6,351,019 B1 | * | 2/2002 | DeBrosse et al. | 257/510 |
| 6,495,896 B1 | * | 12/2002 | Yaegashi et al. | 257/500 |
| 7,307,318 B2 | * | 12/2007 | Iwamatsu et al. | 257/347 |
| 2001/0011758 A1 | * | 8/2001 | Brown et al. | 257/510 |
| 2005/0280115 A1 | * | 12/2005 | Wise et al. | 257/506 |
| 2006/0001104 A1 | * | 1/2006 | Ookura | 257/368 |
| 2006/0043522 A1 | * | 3/2006 | Trivedi | 257/506 |
| 2007/0187797 A1 | * | 8/2007 | Kato et al. | 257/500 |

* cited by examiner

*Primary Examiner*—Eugene Lee
(74) *Attorney, Agent, or Firm*—Scully, Scott, Murphy & Presser, P.C.; H. Daniel Schnurmann

(57) ABSTRACT

A pedestal is formed out of the pad layer such that two edges of the pedestal coincide with a border of the wells as implanted. An extended pedestal is formed over the pedestal by depositing a conformal dielectric layer. The area of the extended pedestal is exposed the semiconductor surface below is recessed to a recess depth. Other trenches including at least one intra-well isolation trench are lithographically patterned. After a reactive ion etch, both an inter-well isolation trench and at least one intra-well isolation trench are formed. The width of the inter-well isolation trench may be reduced due to the deeper bottom surface compared to the prior art structures. The boundary between the p-well and the n-well below the inter-well isolation structure is self-aligned to the middle of the inter-well isolation structure.

11 Claims, 17 Drawing Sheets

SELF-ALIGNED AND EXTENDED INTER-WELL ISOLATION STRUCTURE

FIELD OF THE INVENTION

The present invention relates to a semiconductor structure, and particularly to an intra-well isolation structure having an extended depth relative to an inter-well isolation structure and self-aligned to a boundary between a p-well and an n-well, and methods of manufacturing the same.

BACKGROUND OF THE INVENTION

A typical semiconductor device in a complementary metal-oxide-semiconductor (CMOS) circuit is formed in a p-well or an n-well in a semiconductor substrate. Since other semiconductor devices are also present in the semiconductor substrate, the semiconductor device requires electrical isolation from adjacent semiconductor devices. Electrical isolation is typically provided by isolation structures that employ trenches filled with an insulator material. Electrical isolation of the semiconductor device from other devices located in the same well is called "intra-well isolation." Electrical isolation of the semiconductor device from other devices in an adjacent well of the opposite type is called "inter-well isolation." In both cases, unintended functionality of parasitic devices, such as parasitic pnp or npn bipolar transistors, formed by various elements of the semiconductor device and adjacent semiconductor devices, needs to be suppressed by placing dielectric material, typically in the form of trench isolation structures, in the current paths among the elements of the parasitic devices.

Referring to FIG. 1, a vertical cross-sectional view of a prior art trench isolation structure having minimum separation distances between adjacent device regions shows an inter-well trench isolation structure 4, and two intra-well trench isolation structures 6. The inter-well isolation structure 4 is located at a boundary between the p-well 11 and the n-well 12, and is bounded by a pair of substantially vertical first trench sidewalls 66 and a substantially horizontal first trench bottom surface 67. One of the intra-well trench isolation structures 6 is located within a p-well 11, and is bounded by a pair of substantially vertical intra-well trench sidewalls 16 and one of substantially horizontal intra-well trench bottom surfaces 17. The other of the intra-well trench isolation structures 8 is located within an n-well 12, and is bounded by the other pair of substantially vertical intra-well trench sidewalls 16 and the other of the substantially horizontal intra-well trench bottom surfaces 17. The various isolation structures (4, 6) comprise the same dielectric material.

The depths of the inter-well trench isolation structure 4 and the intra-well trench isolation structures 6 are substantially the same. Variations between the various depths of the trench isolation structures (4, 6), that is, variations in the heights of inter-well trench sidewalls 66 and intra-well trench sidewalls 16 are typically caused by process bias between trenches having different widths during a reactive ion etch of the trenches. Therefore, the inter-well trench bottom surface 67 and the intra-well trench bottom surfaces 17 are substantially at the same depth from a top surface of the semiconductor substrate 8.

Both the p-well 11 and the n-well 12 are located above a substrate layer 10', which typically has the same doping level as the original semiconductor substrate prior to the doping of the wells (11, 12). Typically, at least one heavily n-doped region 91, such as source and drain regions of an n-type field effect transistor, is located above the p-well 11, and at least one heavily p-doped region 92, such as source and drain regions of a p-type field effect transistor, is located above the n-well 12. The at least one heavily n-doped region 91, the at least one heavily p-doped region 92, the p-well 11, the n-well 12, the two intra-well trench isolation structures 6, the inter-well trench isolation structure 4, and the substrate layer 10' are located within a semiconductor substrate 8.

The well boundary 13 between the p-well 11 and the n-well 12 is determined by the location of the edge of a patterned p-well block mask (not shown) during a p-well implantation process and by the location of the edge of a patterned n-well block mask (not shown) during an n-well implantation process. While having coincident two edges of the block masks is ideal, the probability of occurrence of such an event is statistically insignificant since alignment of each block mask involves alignment tolerances, or overlay errors. The well boundary 13 is typically formed in the middle of the edge of the patterned p-well block mask and the edge of the patterned n-well mask. Statistically, the well boundary 12 may be located anywhere between two limits A and B, which are defined by a maximum variation of the overlay of the two edges of the block masks. The distance between the two limits define the range $R_{OL}$ of the well boundary 13, which is typically on the order of about 30 nm for a mid-ultraviolet (MUV) lithography. Calculation of the minimum width of the inter-well isolation trench structure 4 in a semiconductor circuit design needs to factor in this variation to insure that the worst case inter-well isolation distances provide sufficient inter-well isolation to semiconductor devices located nearby.

An inter-well trench minimum width w1_p of the inter-well trench isolation structure 4 is determined by a combination of the depth of the inter-well trench isolation structure 4 (which is the same as the height of the inter-well trench isolation sidewalls 66), the depths of the at least one heavily n-doped region 91 and the at least on heavily p-doped region 92, the doping levels of the p-well 11 and the n-well 12, the overlay tolerances of lithography processes that are used to form the two wells (11, 12), and the operating voltages of the semiconductor devices abutting the inter-well trench isolation structure 4. An intra-well trench minimum width w2_p of the intra-well trench isolation structures 6 is determined by a combination of the depth of the intra-well trench isolation structures 6, the depth of the at least one heavily n-doped region 91 or the at least one heavily n-doped region 92, the doping level of the p-well 11 or the n-well 12, and the operating voltages of the semiconductor devices abutting the intra-well trench isolation structure 6.

The paths of the weakest inter-well isolation in the prior art isolation structure are represented by a prior art heavily n-doped region to n-well separation distance $d_{2p\_p}$ and a prior art heavily p-doped region to p-well separation distance $d_{2n\_p}$ in FIG. 1. Likewise, the path of the weakest intra-p-well isolation in the prior art isolation structure is represented by a prior art heavily n-doped region to another heavily n-doped region separation distance $d_{1p\_p}$. The path of the weakest intra-n-well isolation in the prior art isolation structure is represented by a prior art heavily p-doped region to another heavily p-doped region separation distance $d_{1n\_p}$. From geometrical considerations, the inter-well trench minimum width w1_p needs to be greater than the intra-well trench minimum width w2_p due to the presence of the boundary between the p-well 11 and the n-well 12 near the middle of the inter-well trench isolation structure 4.

For example, the depths of the at least one heavily n-doped region 91 and the at least one heavily p-doped region 92 may be about 80 nm, the depths of the various trench isolation structures (4, 6) may be about 280 nm, and the overlay tolerance of lithography processes for ion implantations well definition may be about 30 nm. For 1.1V operation of semiconductor devices, this requires the inter-well trench minimum width w1_p to be about 208 nm such that each of the prior art heavily n-doped region to n-well separation distance $d_{2p\_p}$ and the prior art heavily p-doped region to p-well separation distance $d_{2n\_p}$ is at least 289 nm. The prior art heavily n-doped region to another heavily n-doped region separation distance $d_{1p\_p}$ exceeds twice the difference between the depth of the intra-well trench isolation structure 6 and the depth of the heavily n-doped region 91, and consequently exceeds 400 nm. The intra-well trench minimum width w2_p may be limited not by intra-well device isolation considerations, but by process capability considerations to insure filling of the intra-well trench isolation structures 6 with a dielectric material. Considerations on the prior art heavily p-doped region to another heavily p-doped region separation distance $d_{1n\_p}$ produces the same result.

Further, the prior art trench isolation structure provides substantially the same depth between the inter-well isolation structure 4 and the intra-well isolation structures 6. Since gap fill characteristics during deposition of dielectric material in a trench depends on the aspect ratio of the trench structure to be filled, a wider trench may have a deeper depth and still be filled. An extended depth would be preferred on an inter-well trench isolation structure having a greater width in this case.

Therefore, there exists a need for an inter-well isolation structure having an extended depth compared to the depth of an intra-well isolation structure having a narrower width and methods of manufacturing the same.

Further, there exists a need for an inter-well trench isolation structure having reduced minimum width compared to the prior art and methods of manufacturing the same.

In addition, there exists a need for such an inter-well trench isolation structure that requires minimal additional processing steps in terms of cost and complexity during the manufacturing.

SUMMARY OF THE INVENTION

The present invention addresses the needs described above by providing an inter-well trench isolation structure having a depth greater than normal trench isolation structures and a well-boundary therebelow that is self-aligned to the center of the inter-well trench isolation structure.

Specifically, each of a p-well and an n-well is formed such that a border of the well substantially coincides with an edge of a patterned pedestal layer. The two edges are selected such that a pedestal is formed out of the pedestal layer. The width of the pedestal may be small enough to allow the two wells to form a boundary after expanding in an anneal process. An extended pedestal may be formed by depositing an extended pedestal layer. A planarization layer is deposited and planarized, followed by removal of the extended pedestal. The semiconductor material is recessed to a recess depth in the exposed portion of the semiconductor substrate. Other trenches including at least one intra-well isolation trench is lithographically patterned. After a reactive ion etch, both an inter-well isolation trench and at least one intra-well isolation trench are formed. The inter-well isolation trench has a deeper bottom surface than the at least one intra-well isolation trench, which provides enhanced electrical isolation. The width of the inter-well isolation trench may be reduced due to the deeper bottom surface compared to the prior art. The boundary between the p-well and the n-well below the inter-well isolation structure is self-aligned to the middle of the inter-well isolation structure.

According to one aspect of the present invention, a semiconductor structure is provided that comprises:
   a. a semiconductor substrate having a top surface;
   b. a pair of substantially vertical first trench sidewalls extending from the top surface to a first depth;
   c. a substantially horizontal first trench bottom surface having a first width and located at the first depth from the top surface and adjoined to the pair of substantially vertical first trench sidewalls;
   d. a pair of substantially vertical second trench sidewalls extending from the top surface to a second depth, wherein the first depth is greater than the second depth; and
   e. a substantially horizontal second trench bottom surface having a second width and located at the second depth from the top surface and adjoined to the pair of substantially vertical second trench sidewalls; wherein the first width is greater than the second width.

The semiconductor structure may further comprise:
   a. an inter-well isolation trench structure bounded by the pair of substantially vertical first trench sidewalls and the substantially horizontal first trench bottom surface and comprising an insulator material; and
   b. an intra-well isolation trench structure bounded by the pair of substantially vertical second trench sidewalls and the substantially horizontal second trench bottom surface and comprising the insulator material.

The semiconductor structure may further comprise:
   a. a p-well having a p-well bottom surface located at a third depth from the top surface and abutting one of the pair of substantially vertical first trench sidewalls;
   b. an n-well having an n-well bottom surface located at a fourth depth from the top surface and abutting the other of the pair of substantially vertical first trench sidewalls; and
   c. a substrate layer adjoining the p-well bottom surface and the n-well bottom surface.

The third depth and the fourth depth may be greater than the first depth. In this case, the p-well abuts one of the pair of substantially vertical first trench sidewalls, the n-well abuts the other of the pair of substantially vertical first trench sidewalls, and the substrate layer abuts the p-well and the n-well.

Alternatively, at least one of the third depth and the fourth depth may be less than the first depth. In this case, the p-well abuts one of the pair of substantially vertical first trench sidewalls, the n-well abuts the other of the pair of substantially vertical first trench sidewalls, and the substrate layer abuts the p-well, the n-well, the substantially horizontal first trench bottom surface, and at least one of the pair of substantially vertical first trench sidewalls.

According to another aspect of the present invention, a method of manufacturing a semiconductor structure comprises:
   a. forming a pedestal on a semiconductor substrate and a p-well and an n-well in the semiconductor substrate, wherein a border of the p-well is coincident with an edge of the pedestal and a border of the n-well is coincident with another edge of the pedestal;
   b. forming a planarization layer over the pedestal and planarizing the planarization layer;
   c. removing the pedestal and exposing a surface of the semiconductor substrate in an inter-well isolation area;
   d. recessing the surface of the semiconductor substrate within the inter-well isolation area;
   e. lithographically patterning and etching the planarization layer in an intra-well isolation area; and f. etching an inter-well isolation trench having a first depth and an intra-well isolation trench having a second depth, wherein the first depth is greater than the second depth.

The method may further comprise:
a. forming a pedestal layer on a semiconductor substrate;
b. applying and lithographically patterning a first photoresist and etching the pedestal layer from a first area which is not covered by the first photoresist;
c. implanting dopants of a first conductivity type into the first area;
d. applying and lithographically patterning a second photoresist and etching the pedestal layer from a second area which is not covered by the second photoresist, wherein the pedestal is formed out of a remaining portion of the pedestal layer; and
e. implanting dopants of a second conductivity type into the second area, wherein the second conductivity type is the opposite type of the first conductivity type.

The method may further comprise:
a. forming an extended pedestal layer directly on the pedestal, wherein the planarization layer is formed directly on the extended pedestal layer;
b. exposing a portion of the extended pedestal layer over the pedestal during the planarizing of the planarization layer; and
c. removing the exposed portion of the extended pedestal layer prior to the recessing of the top surface.

The recessed surface may be filled with a photoresist. The inter-well isolation trench and the intra-well isolation trench may be filled with a dielectric material.

DETAILED DESCRIPTION OF THE INVENTION

Figure 1:
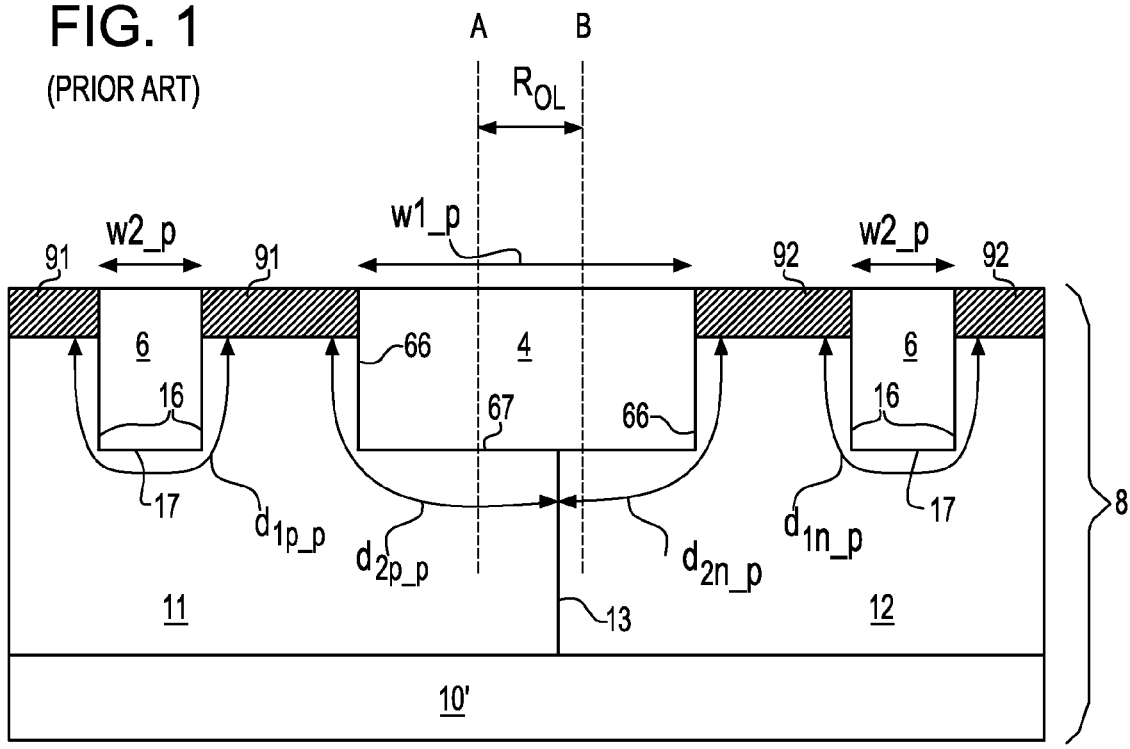
FIG. 1 is a vertical cross-sectional view of a prior art trench isolation structure.

As stated above, the present invention relates to an intra-well isolation structure having an extended depth relative to an inter-well isolation structure and self-aligned to a boundary between a p-well and an n-well and methods of manufacturing the same, which are now described in detail with accompanying figures. It is noted that like and corresponding elements are referred to by like reference numerals.

Figure 2:
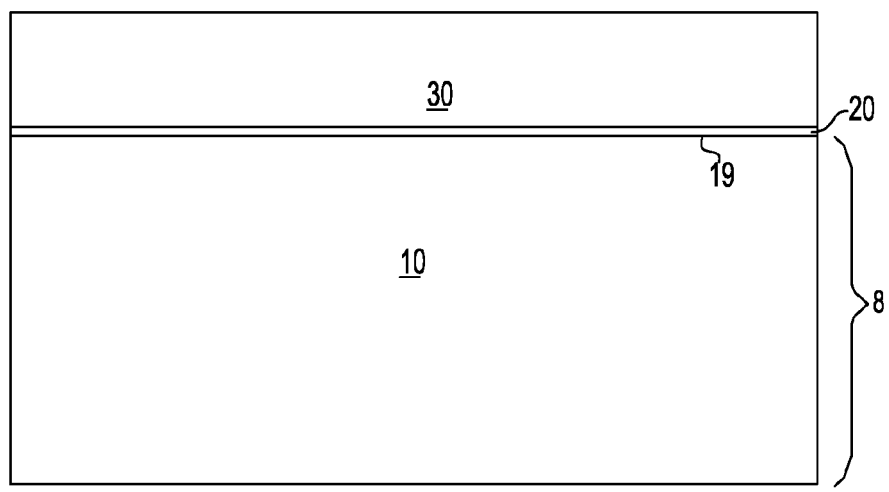
FIGS. 2-22 show sequential vertical cross-sectional views of a first exemplary semiconductor structure according to a first embodiment of the present invention at various stages of a manufacturing sequence.

Referring to FIG. 2, a first exemplary semiconductor structure comprises a semiconductor substrate 8 containing a substrate layer 10, and a stack of a pad layer 20 a pedestal layer 30 formed thereupon. The substrate layer 10 may comprise silicon, silicon-carbon alloy, silicon germanium alloy, silicon-carbon-germanium alloy, GaAs, InAs, InP, other III-V compound semiconductors, or II-VI compound semiconductors. The substrate layer 10 may be p-doped or n-doped, i.e., may have more of p-type dopants than n-type dopants or vice versa. Preferably, the substrate layer 10 has a dopant concentration in the range from about $1.0 \times 10^{15}$ atoms/cm$^3$ to about $1.0 \times 10^{18}$ atoms/cm$^3$. Portions of substrate layer 10 may be removed or implanted with dopants to from another element of the structure during subsequent processing steps, in which case the substrate layer 10 therein refers to the remaining portion having the same dopant concentration as the original substrate layer 10 in FIG. 2.

The material for the pad layer 20 is typically chosen to protect a top surface 19 of the semiconductor substrate 8 and to enhance adhesion between the substrate layer 10 and the pedestal layer 30. The pad layer 20 may comprise an oxide, oxynitride, or a stack of oxide and nitride. Typical thickness of the pad layer 20 is in the range from about 5 nm to about 200 nm, and preferably in the range from about 10 nm to about 50 nm.

The pedestal layer 30 comprises a material that may be etched selective to the pad layer 20 or selective to the material of the substrate layer 10. For example, the pedestal layer 30 may comprise a silicon nitride layer, an amorphous silicon-containing alloy layer, or a polycrystalline silicon-containing alloy layer such as a polysilicon layer. The thickness of the pedestal layer 30 may be in the range from about 20 nm to about 400 nm, and preferably in the range from about 60 nm to about 150 nm. In subsequent processing steps, a "pedestal" is formed out of the pedestal layer 20 by a combination of reactive ion etch processes.

Figure 3:
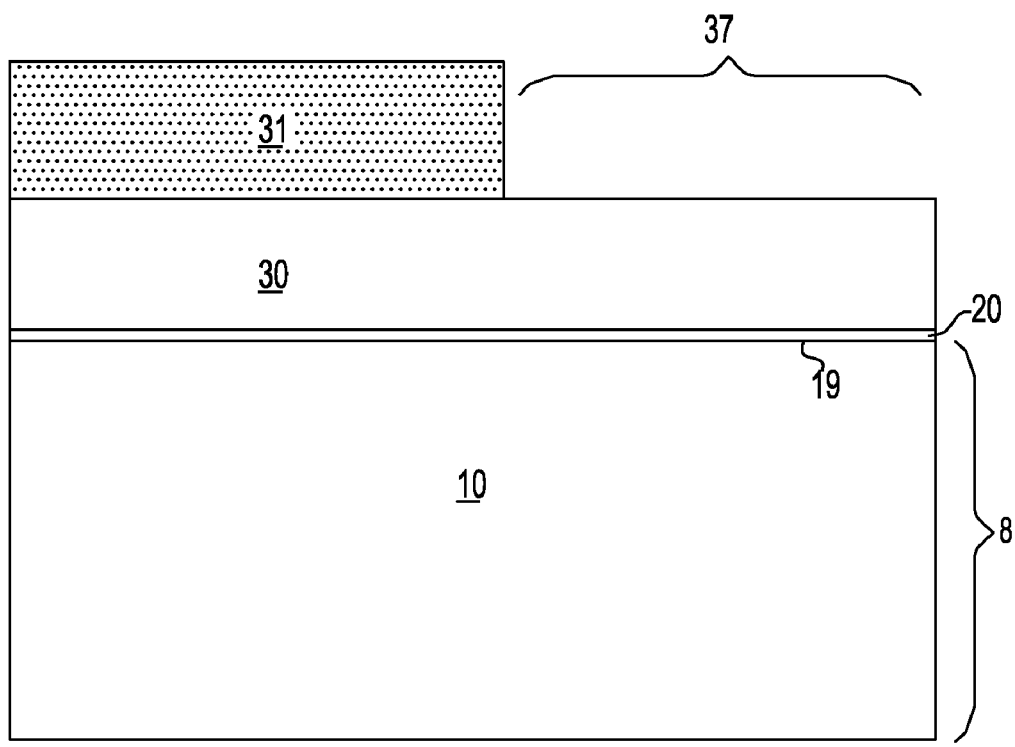

Referring to FIG. 3, a first photoresist 31 is applied to a top surface of the pedestal layer 30 and lithographically patterned to expose an n-well area 37 of the pedestal layer 30.

Figure 4:
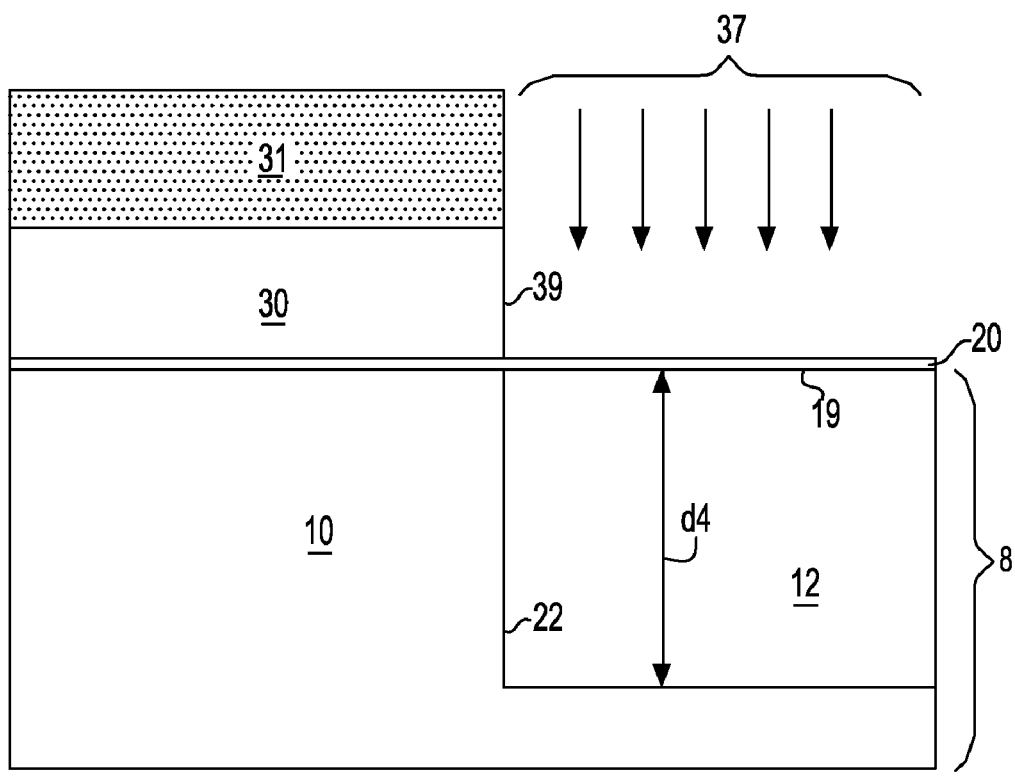

Referring to FIG. 4, the exposed portion of the pedestal layer 30, which is in the n-well area 37, is etched by a first reactive ion etch. A first pedestal sidewall 39 is formed directly beneath an edge of the patterned first photoresist 31. The first reactive ion etch is selective to the substrate layer 10 or the pad layer 20. Preferably, the first reactive ion etch is selective to the pad layer 20 so that the pad layer 20 remains over the substrate layer 10 after the first reactive ion etch.

N-type dopants are implanted into the substrate layer 10 to form an n-well 12 in the semiconductor substrate 8 within the n-well area 37, as symbolized by the arrows in FIG. 4. A vertical n-well to substrate layer interface 22, which is coincident with the first pedestal sidewall 39, is formed between the n-well 12 and the substrate layer 10. The n-type dopants may be selected from P, As, Sb, and a combination thereof. Typically, the n-well 12 has a dopant concentration in the range from about $5.0 \times 10^{16}$ atoms/cm$^3$ to about $5.0 \times 10^{19}$ atoms/cm$^3$. The depth d4 of the n-well 12, as measured from the top surface 19 of the semiconductor substrate 8 to the bottom surface of the n-well 12, and hereafter referred to as a "fourth depth," is typically in the range from about 200 nm to about 1,200 nm, and preferably in the range from 300 nm to about 1,000 nm.

Figure 5:
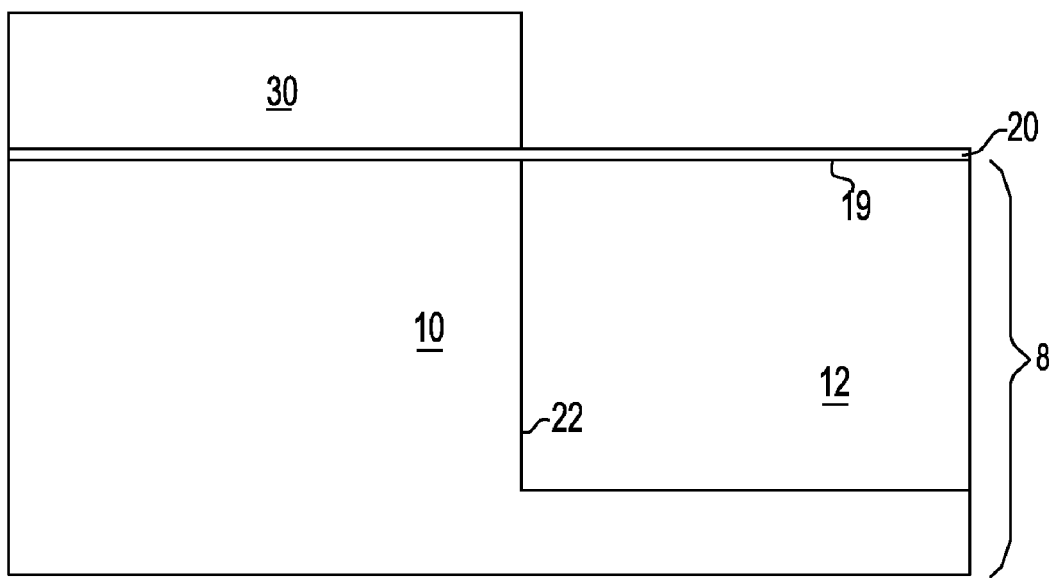

Referring to FIG. 5, the first photoresist 31 is removed from above the pedestal layer 30. The surfaces of the structure may be cleaned as needed.

Figure 6:
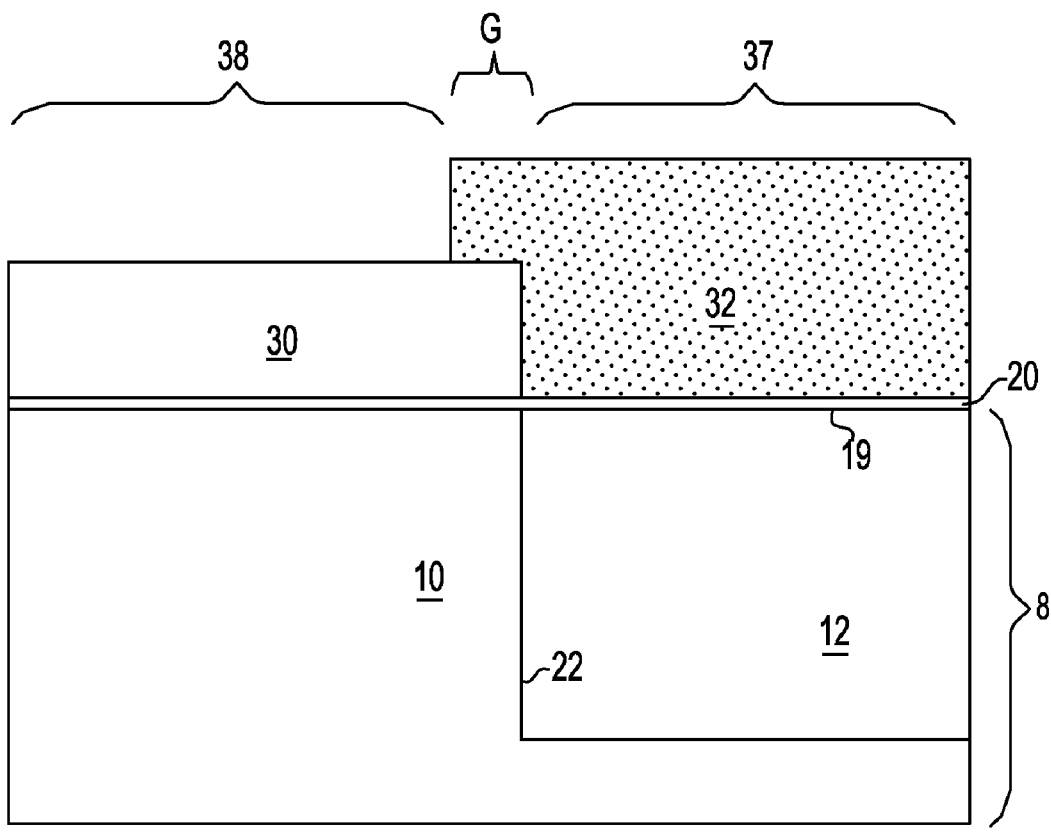

Referring to FIG. 6, a second photoresist 32 is applied to the top surface of the pedestal layer 30 and the exposed surface of the pad layer 20, and lithographically patterned to expose a p-well area 38 of the pedestal layer 30. The n-well area 37 and the p-well area 38 do not overlap. A gap G between the n-well area 37 and the p-well area 38 is greater than the overlay tolerances of the lithographic alignment such that the width of the gap G is greater than zero, i.e., the gap G is formed as a physical entity, even in the worst case lithographic overlay variations.

The nominal width of the gap G may be lithographic or sub-lithographic, i.e., may be greater than or smaller than the minimum feature size that may be formed by normal lithographic processes. For example, the nominal width of the gap G may be in the range from about 10 nm to about 300 nm. Preferably, the nominal width of the gap G is on the order of the critical dimension of lithography tools available in the technology generation that is used in the manufacturing of the semiconductor structure.

Figure 7:
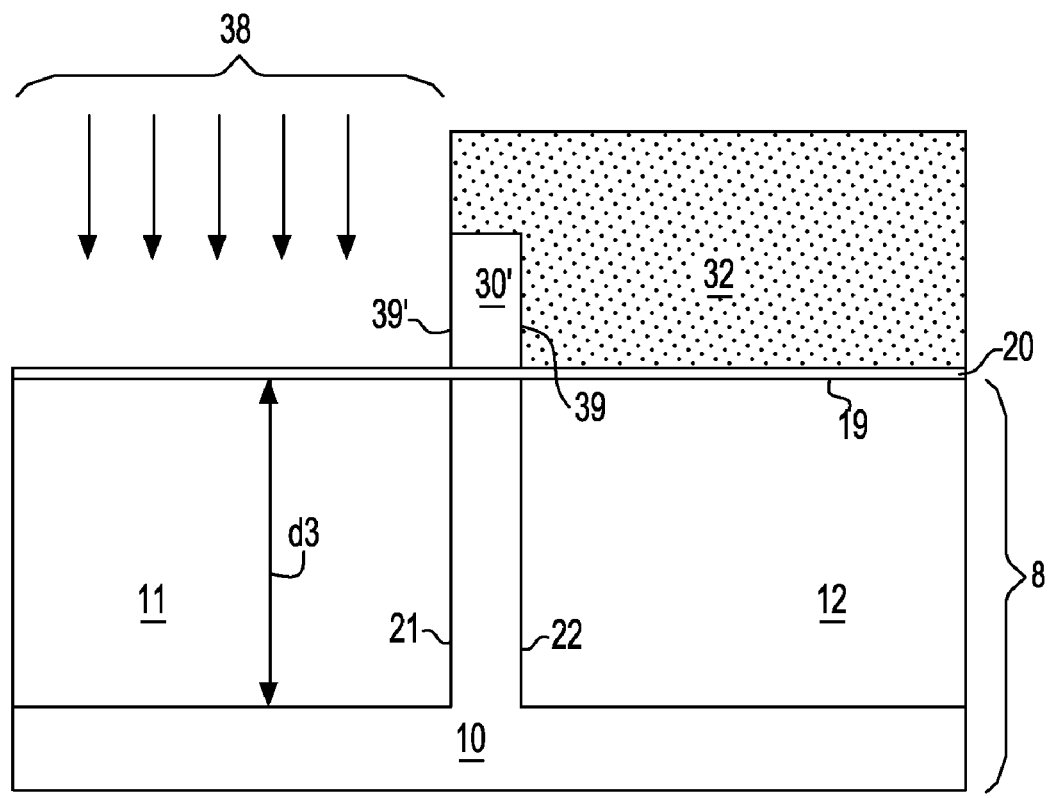

Referring to FIG. 7, the exposed portion of the pedestal layer 30, which is in the p-well area 38, is etched by a second reactive ion etch. A second pedestal sidewall 39' is formed directly beneath an edge of the patterned second photoresist 32. The remaining portion of the pedestal layer 30 forms a pedestal 30' having the first pedestal sidewall 39 and the second pedestal sidewall 39'. The width of the pedestal 30' is substantially the same as the width of the gap G in FIG. 6. The difference between the two widths is caused only by the etch bias of the reactive ion etch processes. The first pedestal sidewall 39 is covered by the second photoresist 32, while the second pedestal sidewall 39' is exposed. The second reactive ion etch is selective to the substrate layer 10 or the pad layer 20. Preferably, the second reactive ion etch is selective to the pad layer 20 so that the pad layer 20 remains over the substrate layer 10 after the second reactive ion etch.

P-type dopants are implanted into the substrate layer 10 to form a p-well 11 in the semiconductor substrate 8 within the p-well area 38, as symbolized by the arrows in FIG. 7. A vertical p-well to substrate layer interface 21, which is coincident with the second pedestal sidewall 39', is formed between the p-well 11 and the substrate layer 10. The p-type dopants may be selected from B, Ga, In and a combination thereof. Typically, the p-well 12 has a dopant concentration in the range from about $5.0 \times 10^{16}$ atoms/cm$^3$ to about $5.0 \times 10^{19}$ atoms/cm$^3$. The depth d3 of the p-well 11, as measured from the top surface 19 of the semiconductor substrate 8 to the bottom surface of the p-well 11, and hereafter referred to as a "third depth," is typically in the range from about 200 nm to about 1,800 nm, and preferably in the range from 300 nm to about 1,000 nm.

Figure 8:
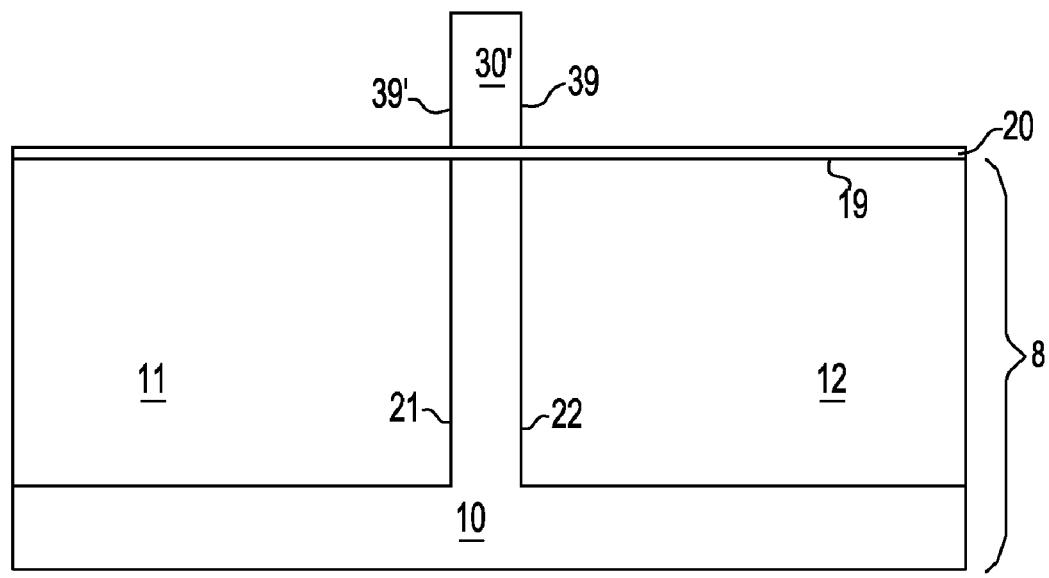

Referring to FIG. 8, the second photoresist 32 is removed to expose both pedestal sidewalls (39, 39') of the pedestal 30'. The surfaces of the structure may be cleaned as needed.

The order of the formation of the n-well 12 and the p-well 11 may be reversed as needed by exchanging the order of lithographic patterning and ion implantation steps, as is well known in the art.

Figure 9:
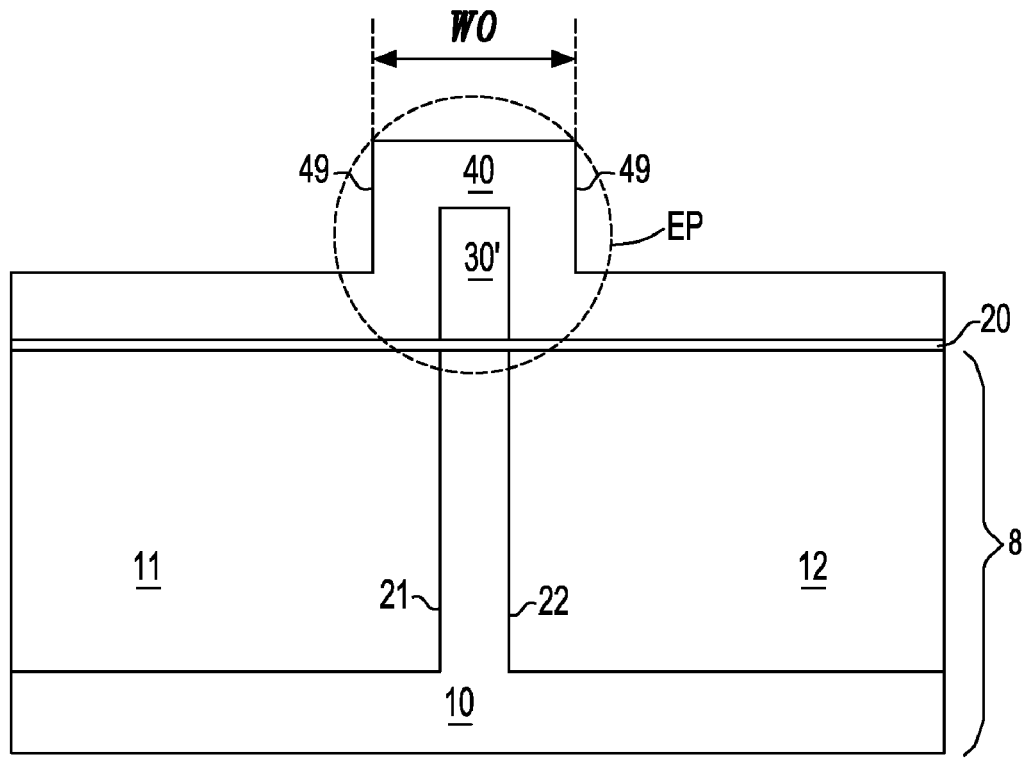

Referring to FIG. 9, optionally but preferably, an extended pedestal layer 40 is deposited directly on the pedestal 30'. The extended pedestal layer 40 is preferably conformal, while a nonconformal pedestal layer may be employed to practice the present invention. The thickness of the extended pedestal layer 40 may be in the range from about 10 nm to about 150 nm. The width of a protruding portion of the extended pedestal layer, or the extended pedestal width W0, connotes the distance between the two substantially vertical sidewalls 49 of the extended pedestal layer 40 over the pedestal 30'. The extended pedestal width W0 may be in the range from about 30 nm to about 600 nm, and preferably in the range from about 60 nm to about 300 nm. The pedestal 30' and the portion of the extended pedestal layer 40 between the two substantially vertical sidewalls 49 form an extended pedestal EP.

The extended pedestal layer 40 comprises a material that may be etched selective to a planarization layer to be subsequently deposited. The extended pedestal layer 40 may comprise the same, or different, material as the pedestal layer 30. For example, the extended pedestal layer 40 may comprise a silicon nitride layer, an amorphous silicon-containing alloy layer, or a polycrystalline silicon-containing alloy layer such as a polysilicon layer. The thickness of the extended pedestal layer 40 may be in the range from about 10 nm to about 200 nm, and preferably in the range from about 30 nm to about 100 nm. For a conformal extended pedestal layer 40, the extended pedestal width W0 is the sum of the width of the pedestal 30' and twice the thickness of the extended pedestal layer 40.

Figure 10:
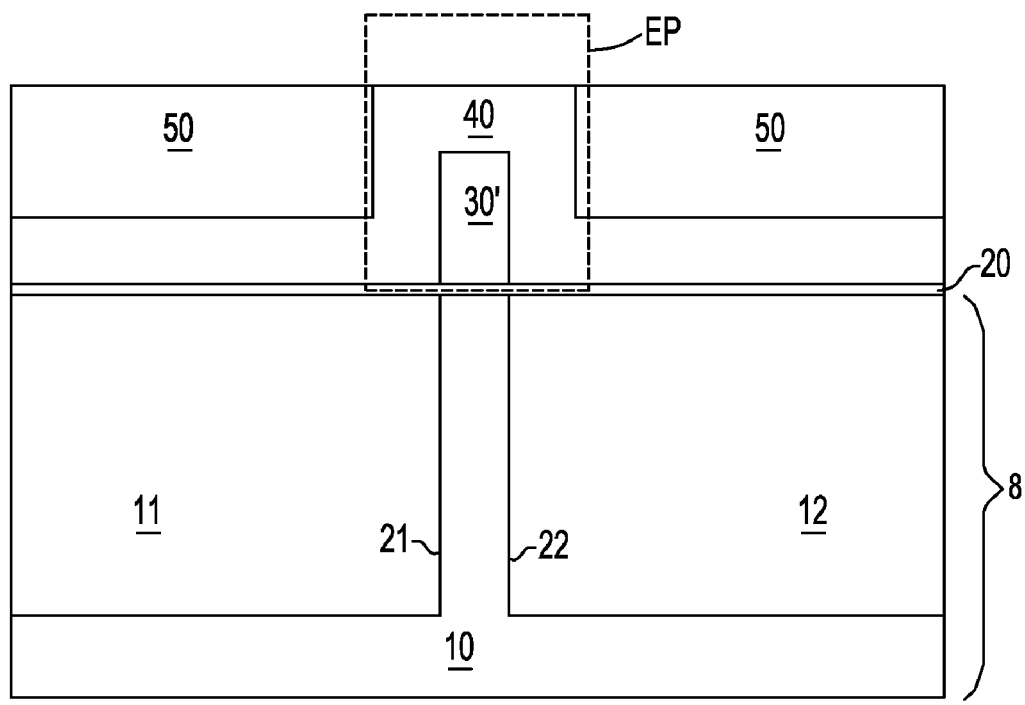

Referring to FIG. 10, a planarization layer 50 is deposited over the extended pedestal layer 40 and planarized to expose the extended pedestal EP. The planarization layer is at least as thick as the thickness of the pedestal layer 30. The planarization layer 50 may comprise a semiconductor material or a dielectric material. The planarization layer 50 has a different composition than the extended pedestal layer 40. For example, the extended pedestal layer 40 may comprise silicon nitride and the planarization layer 50 may comprise silicon oxide or a silicon containing alloy such as amorphous silicon, polysilicon, or a silicon germanium alloy. In another example, the extended pedestal layer 40 may comprise an amorphous silicon-containing alloy or a polycrystalline silicon-containing alloy, and the planarization layer 50 may comprise silicon oxide or silicon nitride.

Figure 11:
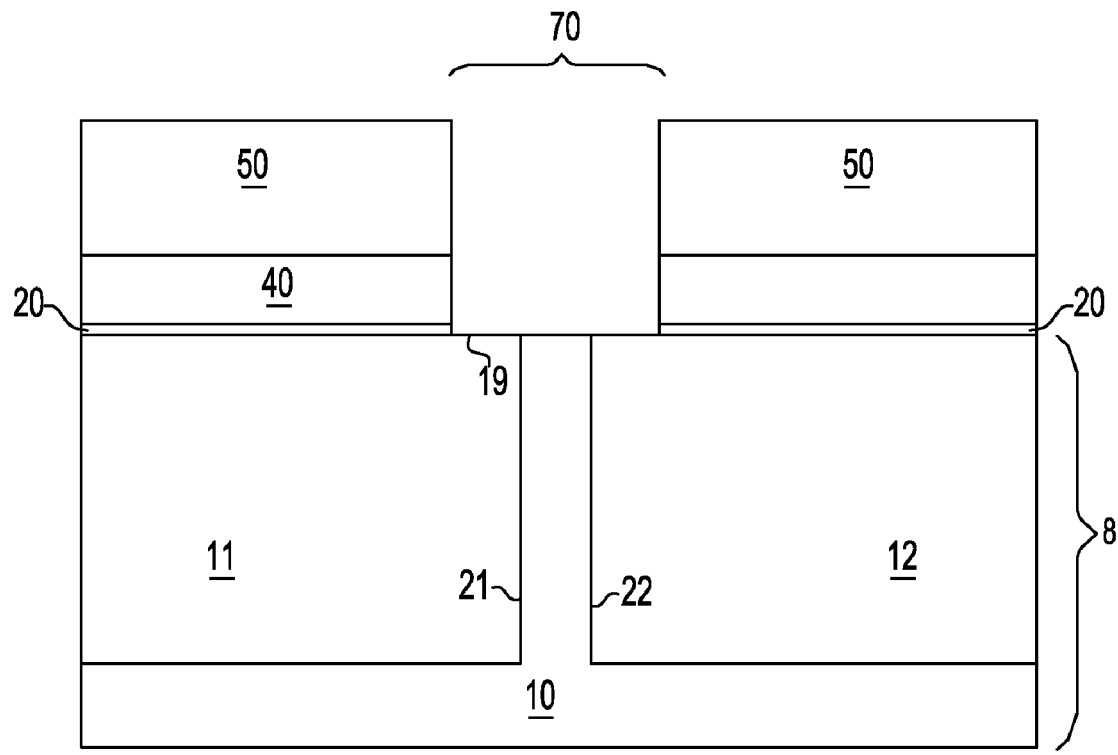

Referring to FIG. 11, the extended pedestal EP is removed preferably by a third reactive ion etch. The top surface 19 of the semiconductor substrate 8 is exposed from the area from which the extended pedestal is removed. The area, as seen from above the semiconductor substrate 8, in which the surface of the semiconductor substrate 8 is exposed is an "inter-well isolation trench area" 70, in which an inter-well isolation trench structure is to be formed subsequently. Typically, the inter-well isolation trench area 70 is formed along the boundaries of the p-well 11 and the n-well 12. The reactive ion etch is preferably selective to the planarization layer 50. A wet etch may be employed to remove the extended pedestal EP if the undercut of the extended pedestal layer 40 outside the volume of the extended pedestal EP can be managed.

Figure 12:
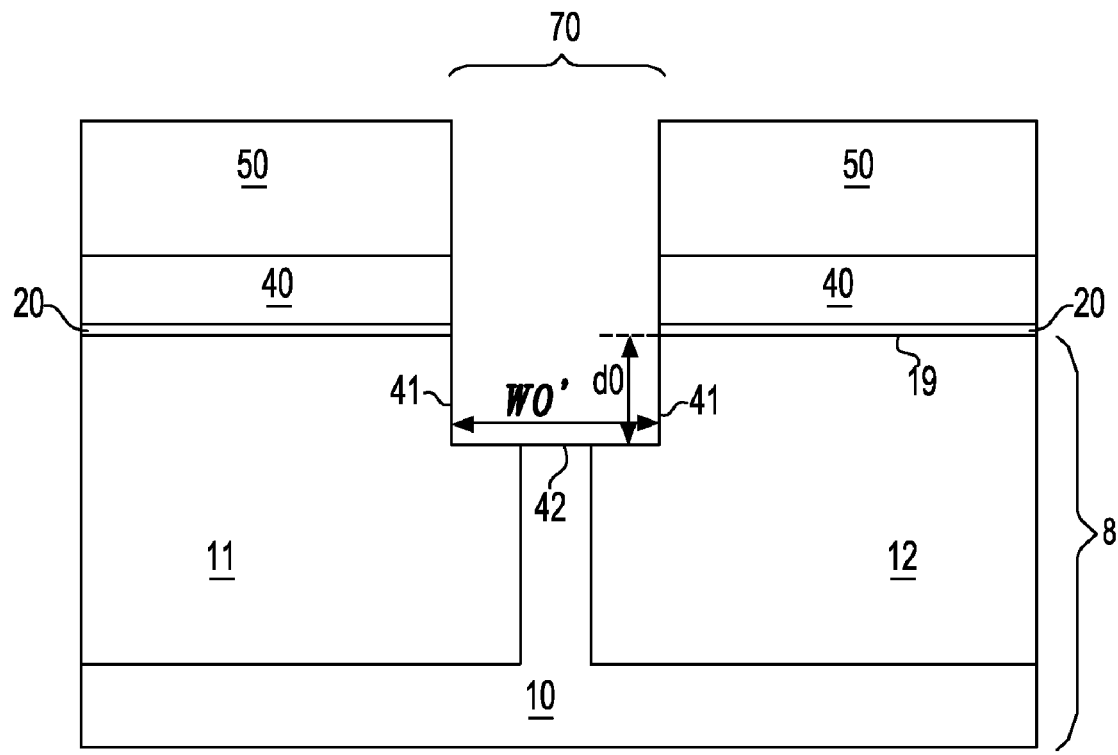

Referring to FIG. 12, the exposed portion of the top surface 19 of the semiconductor substrate 8 is recessed by a fourth reactive ion etch to form an intermediate trench having a recessed surface, or an "intermediate trench bottom surface" 42, and substantially vertical sidewalls, or "intermediate trench sidewalls" 41. The width W0' of the intermediate trench is substantially the same as the extended pedestal width W0 shown in FIG. 9 since the intermediate trench sidewalls 41 are substantially vertical. The depth d0 of the intermediate trench, as measured from the top surface 19 of the semiconductor substrate 8 to the intermediate trench bottom surface 42, is the desired length of extension of depth for an inter-well isolation trench structure to be subsequently formed relative to the depth of an intra-well isolation trench structure also to be subsequently formed. The depth d0 of the intermediate trench may be in the range from about 30 nm to about 1,200 nm, and preferably in the range from about 50 nm to about 400 nm.

Figure 13:
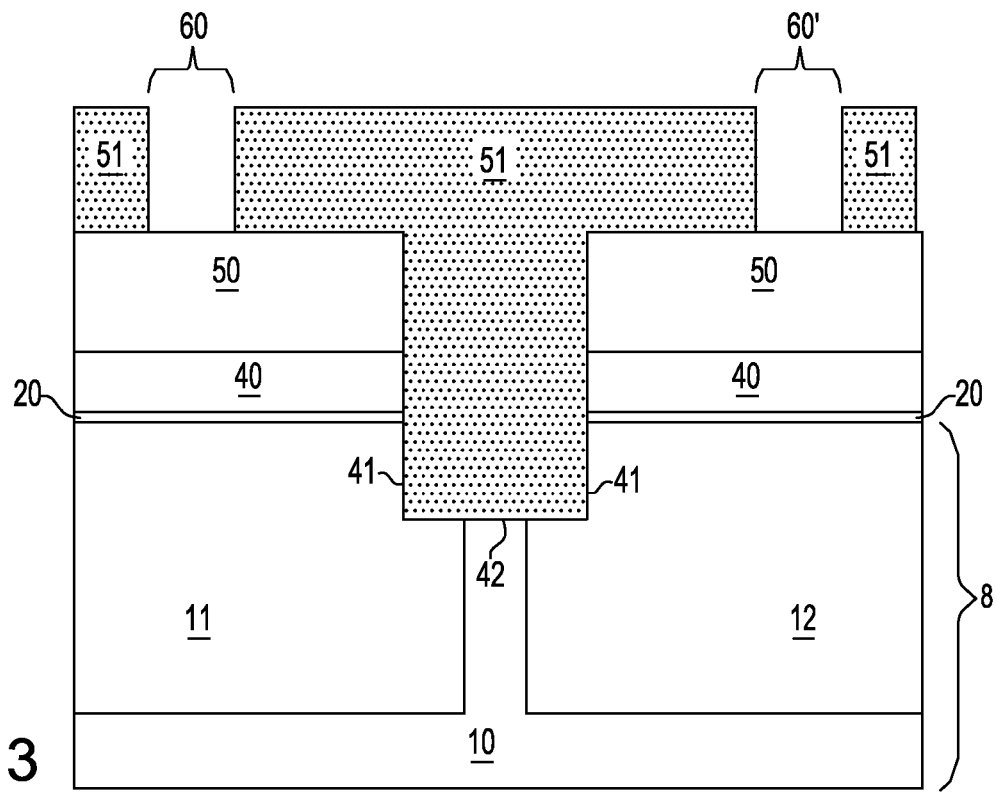

Referring to FIG. 13, a third photoresist 51 is applied over the planarization layer 50 and into the intermediate trench and patterned to form an "intra-well isolation area" 60 over the p-well 11 and another intra-well isolation area 60' over the n-well 12.

Figure 14:
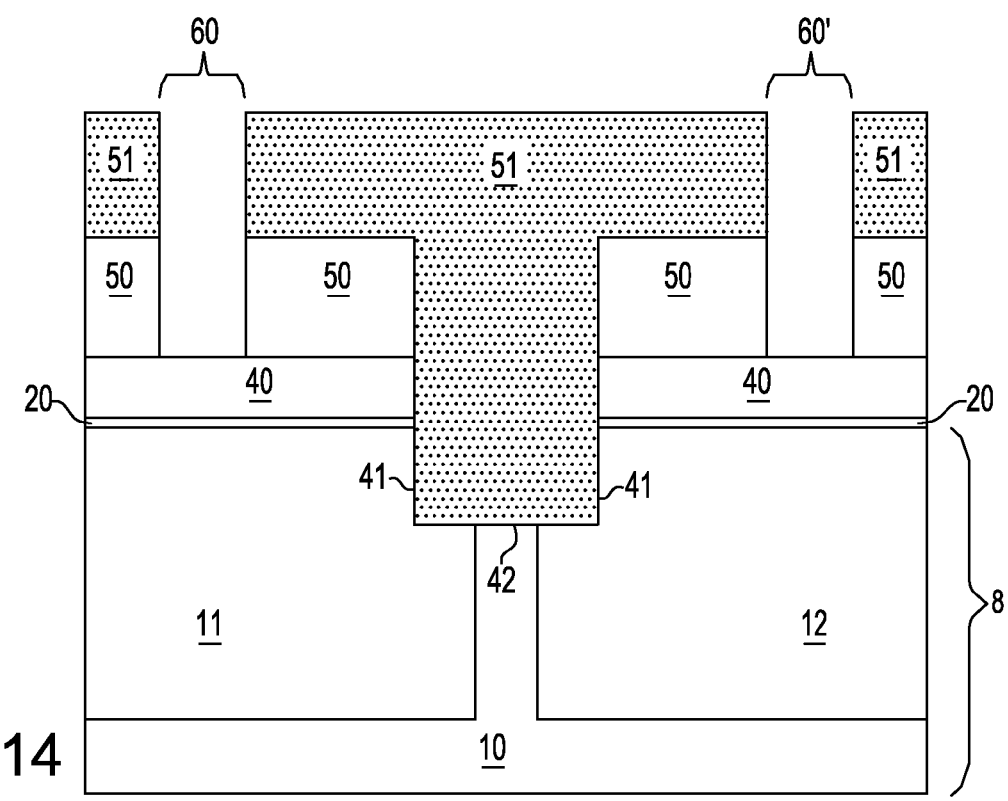

Referring to FIG. 14, the exposed portions of the planarization layer 50 within the intra-well isolation areas (60, 60') are removed by a fifth reactive ion etch.

Figure 15:
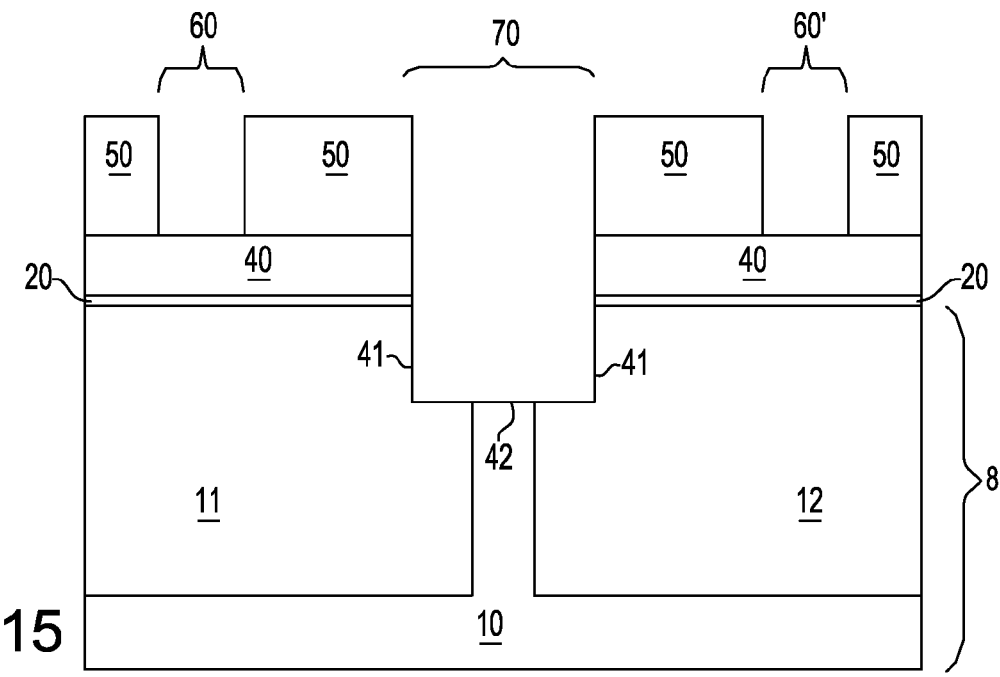

Referring to FIG. 15, the third photoresist 51 is removed. The structure may be cleaned as needed, for example, by a wet clean.

Figure 16:
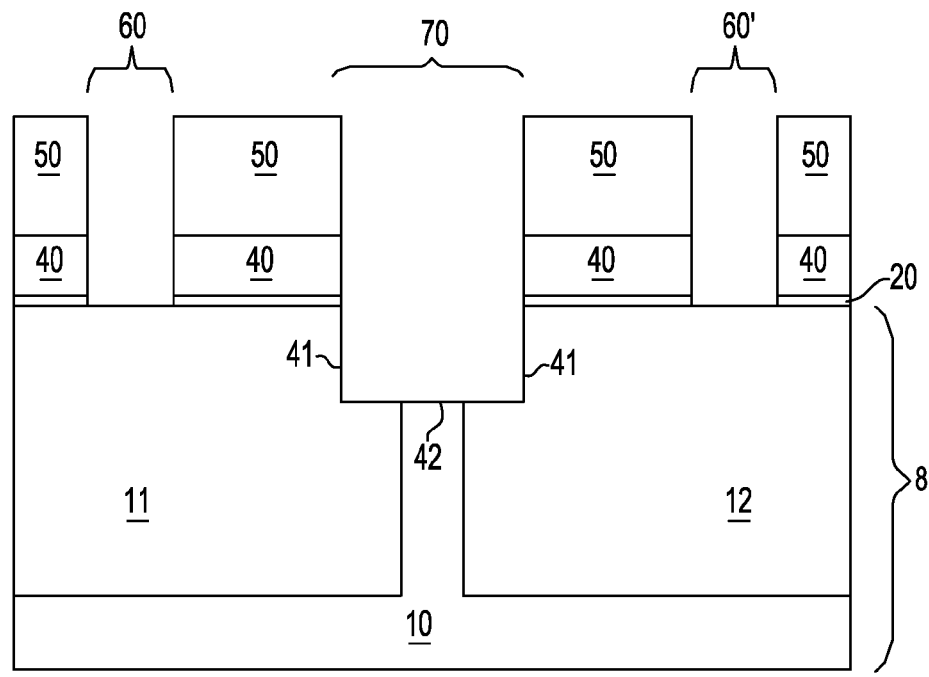

Referring to FIG. 16, the portions of the extended pedestal layer 40 and the pad layer 20 are removed by a sixth reactive ion etch. The top surface 19 of the semiconductor substrate 8 is exposed from the intra-well isolation area (60, 60').

Alternatively, the fifth reactive ion etch, performed at the process step corresponding to the structure shown in FIG. 14, may continue until the structure shown in FIG. 16 is obtained before the third photoresist 51 is removed.

Figure 17:
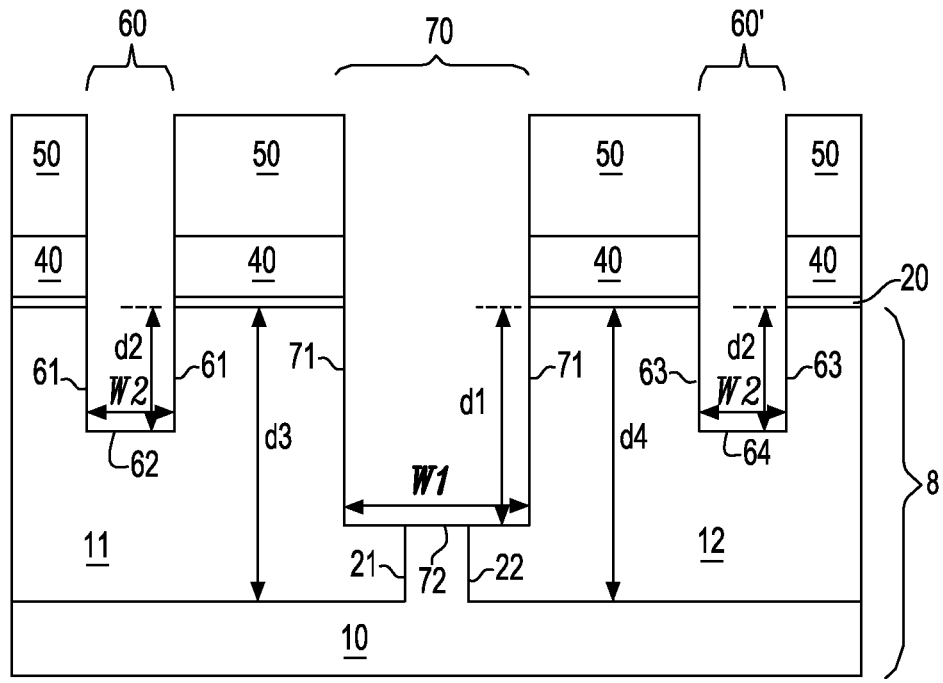

Referring to FIG. 17, a seventh reactive ion etch is performed to form an inter-well isolation trench in the inter-well isolation area 70 and intra-well isolation trenches in the intra-well isolation areas (60, 60'). The intra-well isolation trenches may comprise a first intra-well isolation trench formed in the p-well 11 and a second intra-well isolation trench formed in the n-well 12. The seventh reactive ion etch is selective to at least one of the planarization layer 50 or the extended pedestal layer 40. The planarization layer 50 may, or may not, be completely removed from above the extended pedestal layer 40 during the seventh reactive ion etch.

The inter-well isolation trench comprises a pair of substantially vertical first trench sidewalls 71, which extends from the top surface 19 to a first depth d1, and a substantially horizontal first trench bottom surface 72, which has a first width W1 and located at the first depth d1 from the top surface 19 and adjoined to the pair of substantially vertical first trench sidewalls 71. The first width W1 is substantially the same as the width W0' of the intermediate trench and the extended pedestal width W0 since the pair of substantially vertical first trench sidewalls 71 is substantially vertical. Correspondingly, the first width W1 may be in the range from about 30 nm to about 600 nm, and preferably in the range from about 60 nm to about 300 nm.

The first intra-well isolation trench formed in the intra-well isolation area 60 within the p-well 11 comprises a pair of substantially vertical second trench sidewalls 61, which extends from the top surface 19 to a second depth d2, and a substantially horizontal second trench bottom surface 62, which has a second width W2 and located at the second depth d2 from the top surface 19 and adjoined to the pair of substantially vertical second trench sidewalls 61.

The second intra-well isolation trench formed in the intra-well isolation area 60' within the n-well 12 comprises a pair of substantially vertical third trench sidewalls 63, which extends from the top surface 19 to the second depth d2, and a substantially horizontal third trench bottom surface 64, which has the second width W2 and located at the second depth d2 from the top surface 19 and adjoined to the pair of substantially vertical third trench sidewalls 63.

The first depth d1 is greater than the second depth d2 and the first width W1 is greater than the second width W2. In a variation of the first embodiment, the first intra-well isolation trench and the second intra-well isolation trench may have two different widths, which are less than the first width W1.

Both the third depth d3, which is the depth of the p-well 11, and the fourth depth d4, which is the depth of the n-well, are greater than the first depth d1. The p-well 11 and the n-well 12 abut the substantially horizontal first trench bottom surface 72.

Each of the vertical p-well to substrate layer interface 21 and the vertical n-well to substrate layer interface 22 is separated from one of the pair of substantially vertical first trench sidewalls 71 by a distance equal to the thickness of the extended pedestal layer 40. This is because the vertical p-well to substrate layer interface 21 coincides with the second pedestal sidewall 39', the vertical n-well to substrate layer interface 22 coincides with the first pedestal sidewall 39, and the two substantially vertical sidewalls 49 of the extended pedestal layer 40 coincide with the pair of substantially vertical first trench sidewalls 71. Therefore, the vertical p-well to substrate layer interface 21 and the vertical n-well to substrate layer interface 22 are at an equal distance from the middle of the substantially horizontal first trench bottom surface 72.

The various trench sidewalls (71, 61, 63) are substantially vertical, i.e., have an angle relative to the top surface 19 of the semiconductor substrate in the range from about 80 degrees to about 100 degrees, and preferably in the range from about 85 degrees to about 95 degrees.

The various trench bottom surfaces (72, 62, 64) are substantially horizontal, i.e., have an angle relative to the top surface 19 of the semiconductor substrate in the range from about −10 degrees to about 10 degrees, and preferably in the range from about −5 degrees to about 5 degrees.

Figure 18:
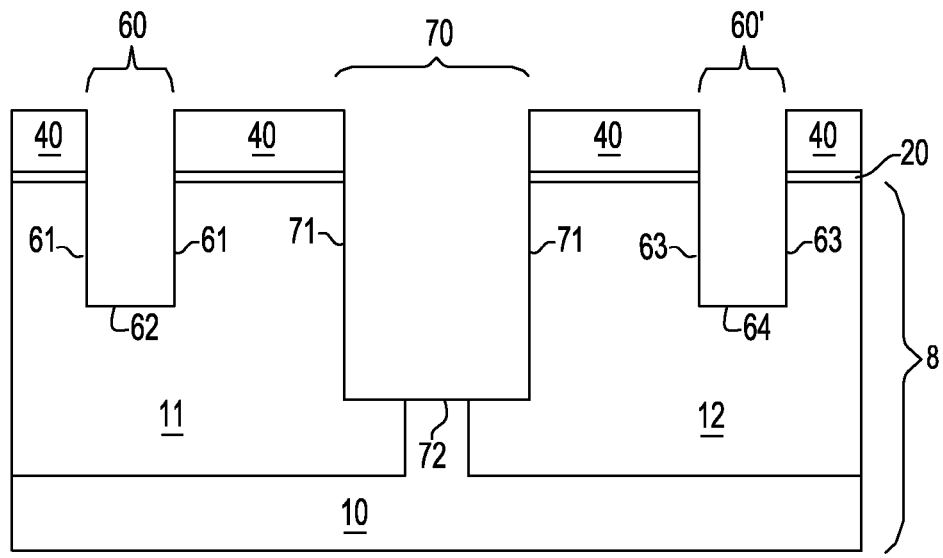

Referring to FIG. 18, the planarization layer 50 is removed, for example, by a wet etch, if it is present on the first exemplary structure at this point. The chemistry of the wet etch is preferably selective to the semiconductor material in the semiconductor substrate 8.

Figure 19:
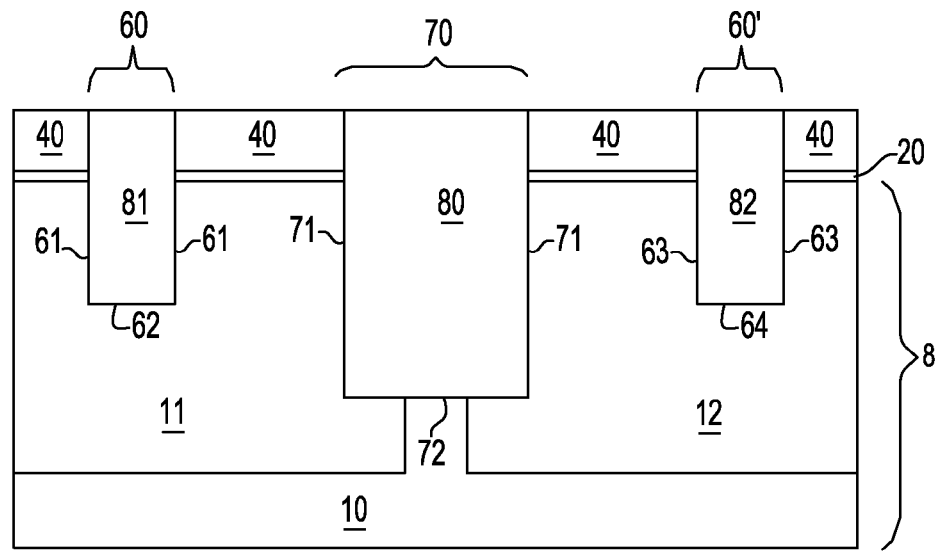

Referring to FIG. 19, a dielectric material is deposited in the inter-well isolation trench, the first intra-well isolation trench, and the second intra-well isolation trench, and planarized, for example, by chemical mechanical polish (CMP) employing the extended pedestal layer as a stopping layer. The dielectric material forms an inter-well isolation trench structure 80 within the inter-well isolation trench, a first intra-well isolation trench structure 81 within the first intra-well isolation trench, and a second intra-well isolation trench structure 82 within the second intra-well isolation trench. The inter-well isolation trench structure 80 is located between the p-well 11 and the n-well 12, the first intra-well isolation trench structure 81 is located within the p-well 11, and the second intra-well isolation trench structure is located within the n-well 12.

The dielectric material may comprise an oxide, a nitride, an oxynitride, or a combination thereof. The dielectric material may comprise a dielectric liner contacting the various trench sidewalls (71, 61, 63) and/or the various trench bottom surfaces (72, 62, 64). For example, the dielectric material may comprise silicon oxide.

Figure 20:
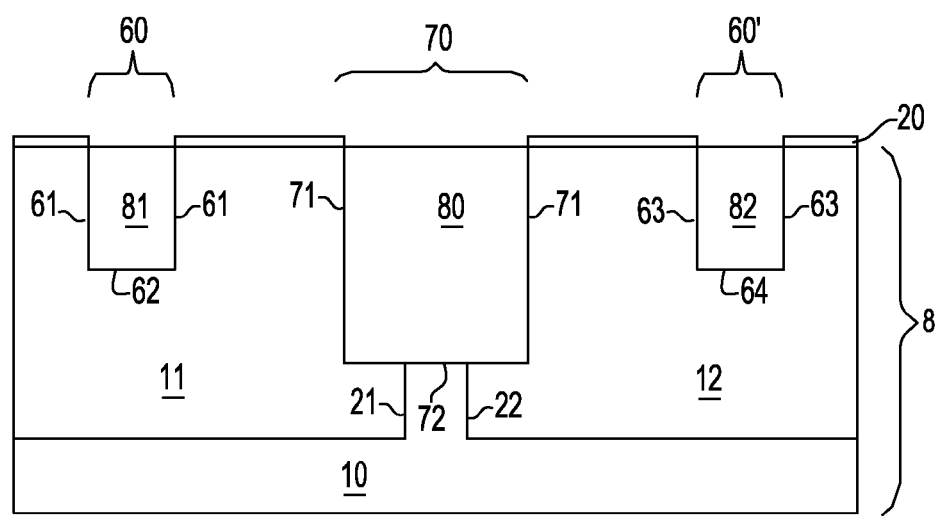

Referring to FIG. 20, the inter-well isolation trench structure 80 and the intra-well isolation trench structures (81, 82) are recessed relative to the extended pedestal layer 40 so that the recessed surfaces are substantially coplanar with the top surface 19 of the semiconductor substrate 8. Subsequently, the extended pedestal layer 40 is removed, for example, by a wet etch.

Figure 21:
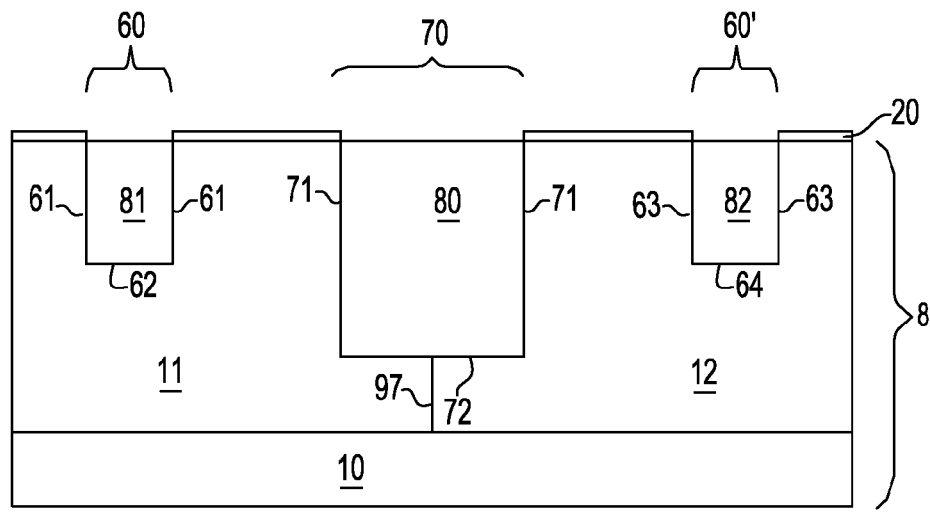

Referring to FIG. 21, the p-well 11 and the n-well 12 may expand in size during an anneal, which may be a dedicated well activation anneal or another process performed at temperature sufficiently high enough to activate dopants. A well boundary 97 at which the p-well 11 adjoins the n-well 12 is formed. The well boundary 97 also adjoins the substantially horizontal first trench bottom surface 72. Since the vertical p-well to substrate layer interface 21 and the vertical n-well to substrate layer interface 22 are at an equal distance from the middle of the substantially horizontal first trench bottom surface 72 prior to the activation anneal as described above, the well boundary 97 is self-aligned to the middle of the substantially horizontal first trench bottom surface 72.

Figure 22:
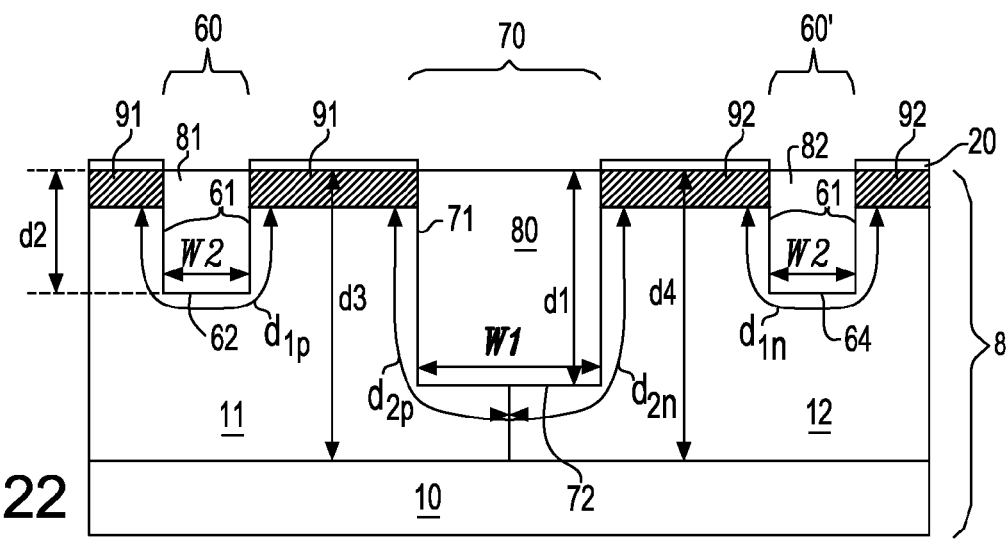

Referring to FIG. 22, a heavily n-doped region 91 and a heavily p-doped region 92 are formed by employing block masks (not shown) and ion implantation processes in a manner similar to the formation of the p-well 11 and the n-well 12. The heavily n-doped region 91 and the heavily p-doped region abut the top surface 19 of the semiconductor substrate 8 and may abut the pair of substantially vertical first trench sidewalls 71. Each of the at least one heavily n-doped region 91 and the at least one heavily p-doped region 92 has a dopant concentration in the range from about $5.0 \times 10^{19}$ atoms/cm$^3$ to about $5.0 \times 10^{21}$ atoms/cm$^3$. The heavily doped regions (91, 92) may be source and drain regions of field effect transistors.

Both the third depth d3, which is the depth of the p-well 11, and the fourth depth d4, which is the depth of the n-well, are greater than the first depth d1. The p-well 11 and the n-well 12 abut the substantially horizontal first trench bottom surface 72. The substrate layer 10 abuts both the p-well 11 and the n-well 12 but does not abut the substantially horizontal first trench bottom surface 72.

The path of the weakest intra-p-well isolation is represented by a heavily n-doped region to another heavily n-doped region separation distance $d_{1p}$. The path of the weakest intra-n-well isolation is represented by a heavily p-doped region to another heavily p-doped region separation distance $d_{1n}$. For identical dimensions in the first intra-well isolation structure 81 and/or in the second intra-well isolation structure 82, both the prior art and the present invention result in the same heavily n-doped region to another heavily n-doped region separation distance $d_{1p}$ and/or heavily p-doped region to another heavily p-doped region separation distance $d_{1n}$.

The present invention increases the length of paths of the weakest inter-well isolation for comparable widths of an inter-well isolation area 70 relative to the prior art structure described above. The paths of the weakest inter-well isolation in the first exemplary isolation structure are represented by a heavily n-doped region to n-well separation distance $d_{2p}$ and a heavily p-doped region to p-well separation distance $d_{2n}$, each of which is extended by the difference between the first depth d1 and the second depth d2 compared to the prior art structure. In other words, while the prior art provides the same depth for all trench isolation structures, the present invention provides a deeper depth d1 for the inter-well trench isolation structure 80. The difference between the first depth d1 and the second depth d2 is substantially the same as the depth d0 of the intermediate trench may be in the range from about 30 nm to about 1,200 nm, and preferably in the range from about 50 nm to about 400 nm. Compared to the prior art, the increase in the separation distances $d_{2p}$ and $d_{2n}$ enables reduction of the width of the inter-well isolation area 70 and consequent increase in the density of semiconductor devices on a semiconductor chip.

For example, the depths of the at least one heavily n-doped region 91 and the at least one heavily p-doped region 92 may be about 80 nm, the first depth d1 may be about 480 nm, and the second depth may be about 280 nm. Both the heavily n-doped region to n-well separation distance $d_{2p}$ and a heavily p-doped region to p-well separation distance $d_{2n}$ are increased by the increased amount of the first depth d1 relative to the second depth d2, which is 200 nm, relative to an inter-well isolation trench structure having the second depth d2. Utilizing the increased depth of the inter-well trench isolation structure 80, the minimum width of the inter-well isolation area 70 may be reduced as long as the aspect ratio of the inter-well isolation trench is conducive to a fill process by the dielectric material that forms the inter-well trench isolation structure 80. Such reduction in the minimum width of the inter-well isolation area 70 enables design of CMOS circuits with higher device density.

Figure 23:
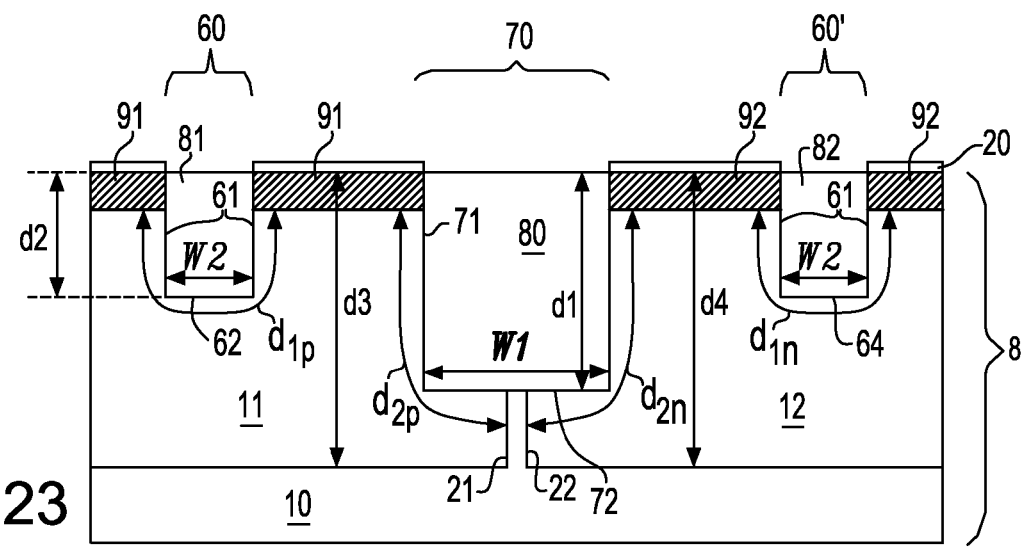
FIG. 23 shows a vertical cross-sectional view of a second exemplary semiconductor structure according to a second embodiment of the present invention.

Referring to FIG. 23, a second exemplary structure according to a second embodiment of the present invention is shown. The same process sequence is employed as in the first embodiment of the present invention. However, the p-well 11 and the n-well 12 does not expand sufficiently during an anneal such that the vertical p-well to substrate layer interface 21 and the vertical n-well to substrate layer interface 22 do not meet. Consequently, a well boundary is not formed. Instead, the distance between the vertical p-well to substrate layer interface 21 and the vertical n-well to substrate layer interface 22 is reduced relative to the distance prior to the anneal. Prior to anneal, the vertical p-well to substrate layer interface 21 and the vertical n-well to substrate layer interface are at an equal distance from the middle of the substantially horizontal first trench bottom surface 72 even after the anneal.

Both the third depth d3, which is the depth of the p-well 11, and the fourth depth d4, which is the depth of the n-well, are greater than the first depth d1. The p-well 11 and the n-well 12 abut the substantially horizontal first trench bottom surface 72. The substrate layer 10 abuts the p-well 11, the n-well 12, and the substantially horizontal first trench bottom surface 72.

Figure 24:
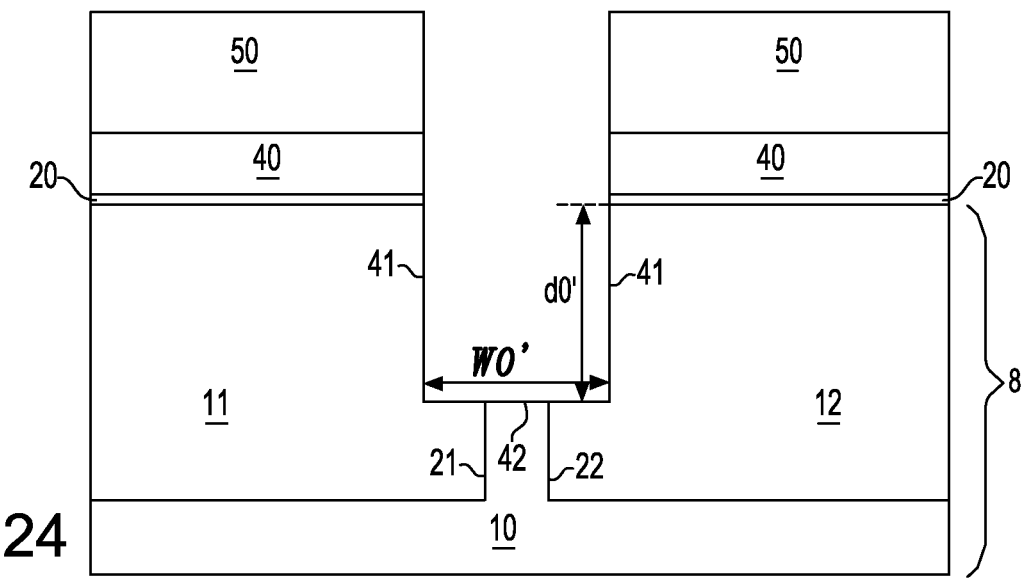
FIGS. 24-33 show sequential vertical cross-sectional views of a second exemplary semiconductor structure according to a second embodiment of the present invention at selected stages of a manufacturing sequence.

Referring to FIG. 24, a third exemplary structure according to a third embodiment of the present invention is obtained from the first exemplary structure shown in FIG. 12 by extending the fourth reactive ion etch. Thus, the intermediate trench having a recessed surface, or the "intermediate trench bottom surface" 42, and the substantially vertical sidewalls, or the "intermediate trench sidewalls" 41, is deeper according to the third embodiment of the present invention relative to that according to the intermediate trench according to the first embodiment of the present invention. In other words, the depth d0' of the intermediate trench of the third embodiment is deeper than the depth d0 of the intermediate trench of the first embodiment. The depth d0' of the intermediate trench according to the third embodiment may be in the range from about 200 nm to about 2,000 nm, and preferably in the range from about 600 nm to about 1,400 nm. The width W0' of the intermediate trench according to the third embodiment is substantially the same as the extended pedestal width W0 shown in FIG. 9 since the intermediate trench sidewalls 41 are substantially vertical.

Figure 25:
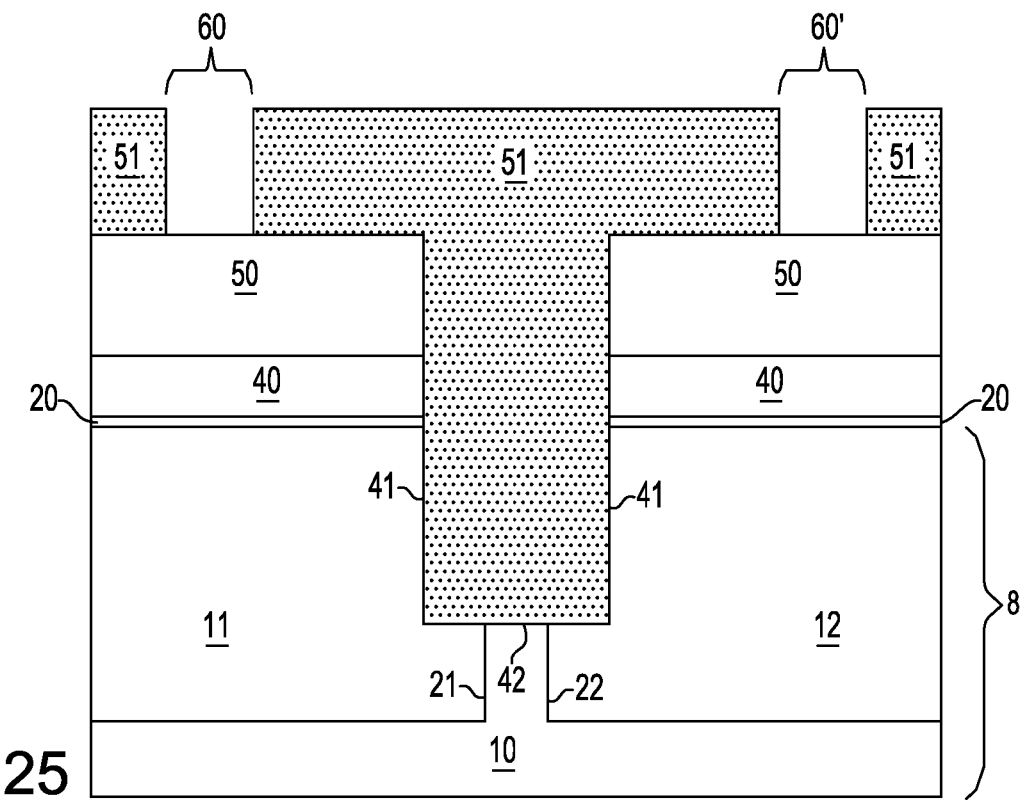

Referring to FIG. 25, a third photoresist 51 is applied over the planarization layer 50 and into the intermediate trench and patterned to form an intra-well isolation area 60 over the p-well 11 and another intra-well isolation area 60' over the n-well 12.

Figure 26:
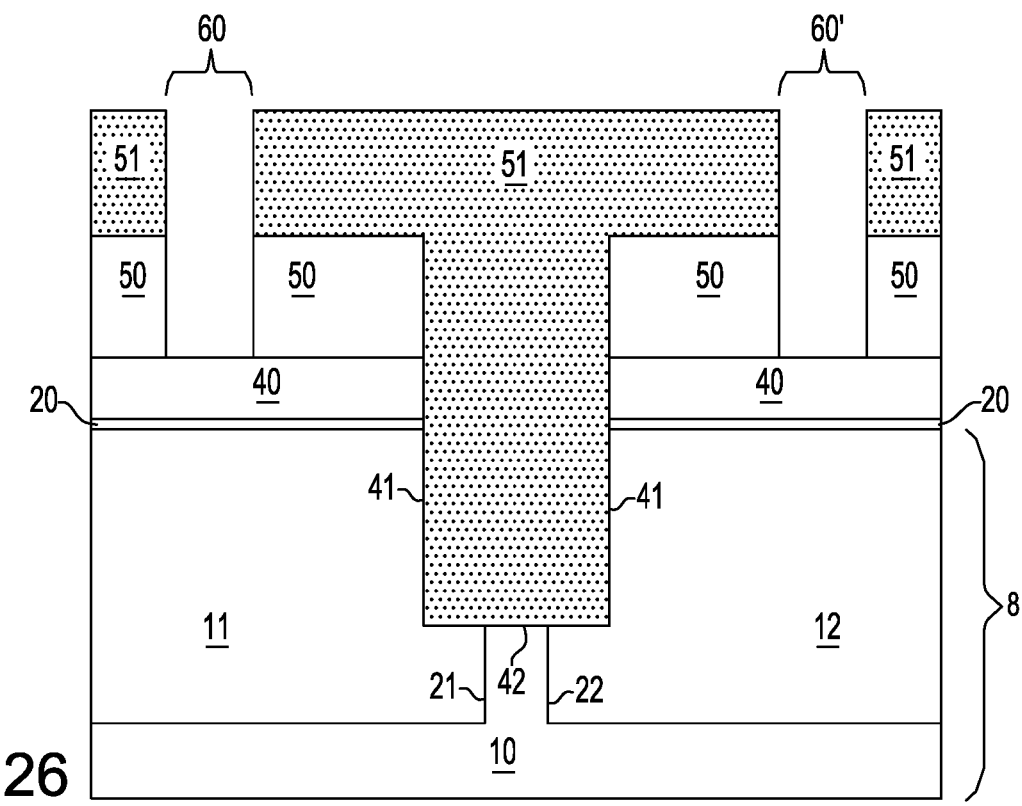

Referring to FIG. 26, the portions of the planarization layer 50 within the intra-well isolation areas (60, 60') are removed by a fifth reactive ion etch.

Figure 27:
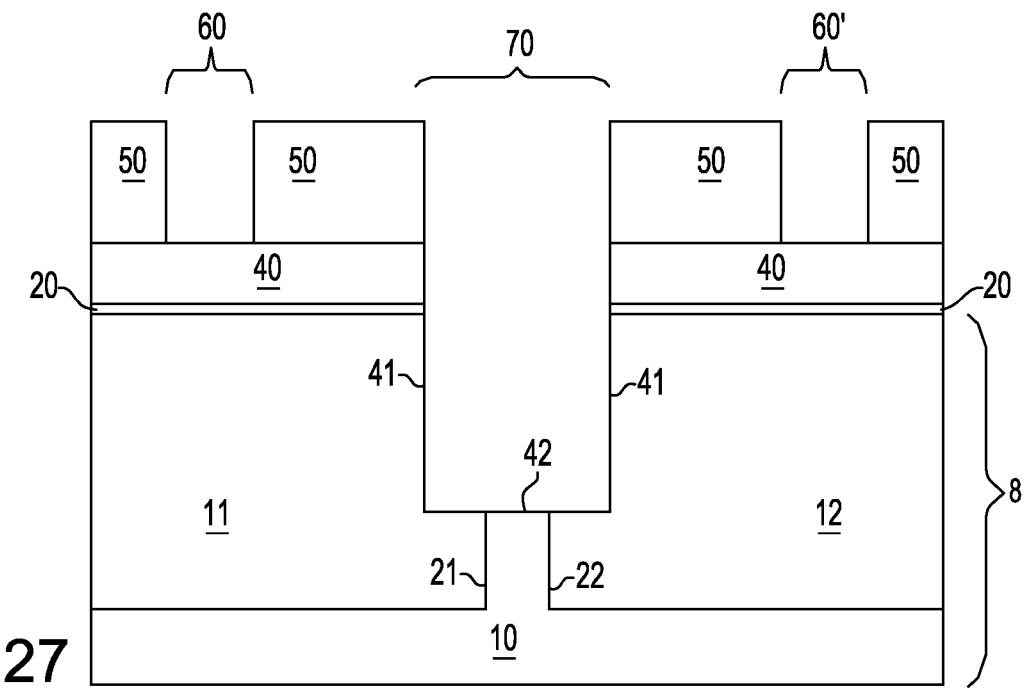

Referring to FIG. 27, the third photoresist 51 is removed. The structure may be cleaned as needed, for example, by a wet clean.

Figure 28:
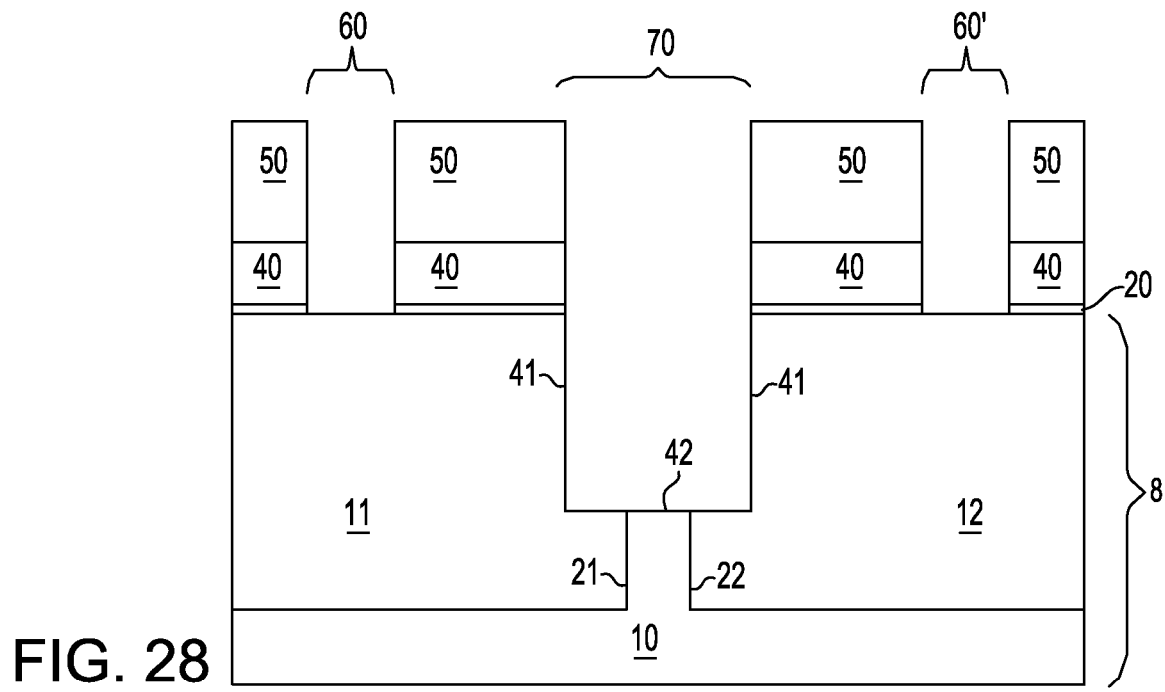

Referring to FIG. 28, the exposed portions of the extended pedestal layer 40 and the pad layer 20 are removed by a sixth reactive ion etch. The top surface 19 of the semiconductor substrate 8 is exposed from the intra-well isolation area (60, 60').

Alternatively, the fifth reactive ion etch, performed at the process step corresponding to the structure shown in FIG. 26, may continue until the structure shown in FIG. 28 is obtained before the third photoresist 51 is removed.

Figure 29:
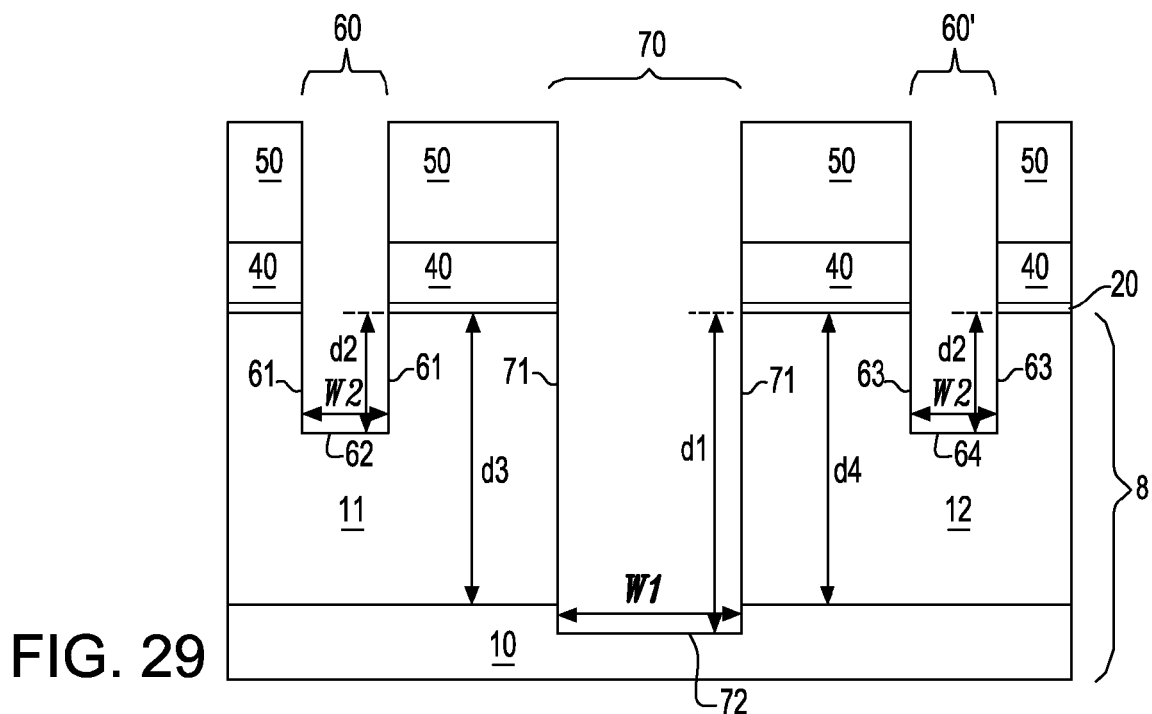

Referring to FIG. 29, a seventh reactive ion etch is performed to form an inter-well isolation trench in the inter-well isolation area 70 and intra-well isolation trenches in the intra-well isolation areas (60, 60'). The intra-well isolation trenches may comprise a first intra-well isolation trench formed in the p-well 11 and a second intra-well isolation trench formed in the n-well 12. The seventh reactive ion etch is selective to at least one of the planarization layer 50 or the extended pedestal layer 40. The planarization layer 50 may, or may not, be completely removed from above the extended pedestal layer 40 during the seventh reactive ion etch.

The inter-well isolation trench comprises a pair of substantially vertical first trench sidewalls 71, which extends from the top surface 19 to a first depth d1, and a substantially horizontal first trench bottom surface 72, which has a first width W1 and located at the first depth d1 from the top surface 19 and adjoined to the pair of substantially vertical first trench sidewalls 71. The first width W1 is substantially the same as the width W0' of the intermediate trench and the extended pedestal width W0 since the pair of substantially vertical first trench sidewalls 71 is substantially vertical. Correspondingly, the first width W1 may be in the range from about 30 nm to about 600 nm, and preferably in the range from about 60 nm to about 300 nm.

The first intra-well isolation trench formed in the intra-well isolation area 60 within the p-well 11 comprises a pair of substantially vertical second trench sidewalls 61, which extends from the top surface 19 to a second depth d2, and a substantially horizontal second trench bottom surface 62, which has a second width W2 and located at the second depth d2 from the top surface 19 and adjoined to the pair of substantially vertical second trench sidewalls 61.

The second intra-well isolation trench formed in the intra-well isolation area 60' within the n-well 12 comprises a pair of substantially vertical third trench sidewalls 63, which extends from the top surface 19 to the second depth d2, and a substantially horizontal third trench bottom surface 64, which has the second width W2 and located at the second depth d2 from the top surface 19 and adjoined to the pair of substantially vertical third trench sidewalls 63.

The first depth d1 is greater than the second depth d2 and the first width W1 is greater than the second width W2. In a variation of the third embodiment, the first intra-well isolation trench and the second intra-well isolation trench may have two different widths, which are less than the first width W1.

At least one of the third depth d3, which is the depth of the p-well 11, and the fourth depth d4, which is the depth of the n-well, is less than the first depth d1. In other words, only the third depth d3 may be less than the first depth d1, only the fourth depth d4 may be less than the fist depth d1, or both the third depth d3 and the fourth depth d4 may be less than the first depth d1. At least one of the p-well 11 and the n-well 12 do not abut the substantially horizontal first trench bottom surface 72. If the third depth d3 is less than the first depth d1, the p-well 11 does not abut the substantially horizontal first trench bottom surface 72. If the fourth depth d4 is less than the first depth d1, the n-well 12 does not abut the substantially horizontal first trench bottom surface 72. The p-well 11 abuts one of the pair of substantially vertical first trench sidewalls 71. The n-well 12 abuts the other of the pair of substantially vertical first trench sidewalls 71. The substrate layer 10 abuts the substantially horizontal first trench bottom surface 72 and at least one of the pair of substantially vertical first trench sidewalls 71.

At least one of the vertical p-well to substrate layer interface 21 and the vertical n-well to substrate layer interface 22, shown in FIG. 28, is removed by the inter-well isolation trench. FIG. 29 shows a case in which both of the vertical p-well to substrate layer interface 21 and the vertical n-well to substrate layer interface 22 are removed by the inter-well isolation trench. If only one of the third depth d3 and the fourth depth d4 is less than the first depth d1, only one of the vertical p-well to substrate layer interface 21 and the vertical n-well to substrate layer interface 22 is removed by the inter-well isolation trench. A structure for such a case may be constructed from FIG. 29 and FIG. 17 by one of ordinary skill in the art.

Figure 30:
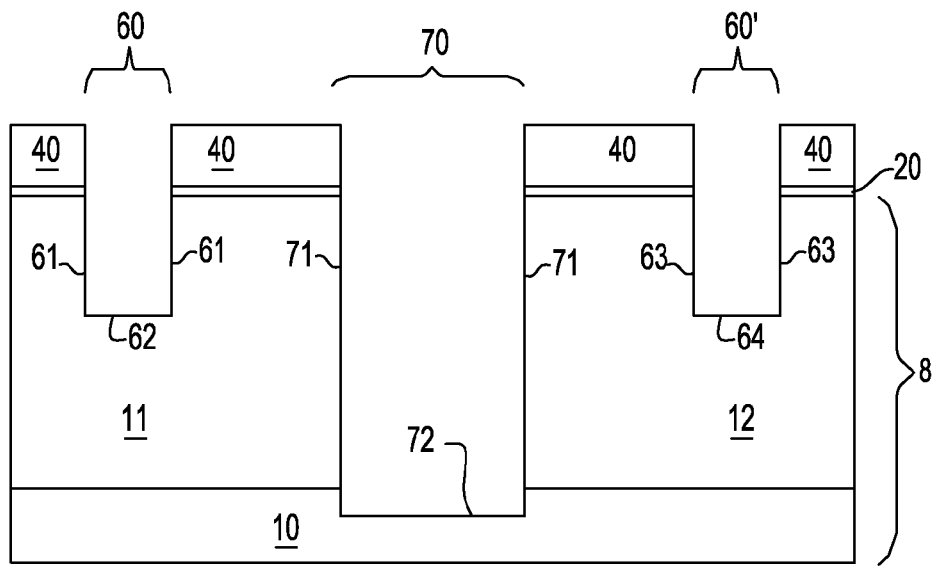

Referring to FIG. 30, the planarization layer 50 is removed, for example, by a wet etch, if it is present on the first exemplary structure at this point. The chemistry of the wet etch is preferably selective to the semiconductor material in the semiconductor substrate 8.

Figure 31:
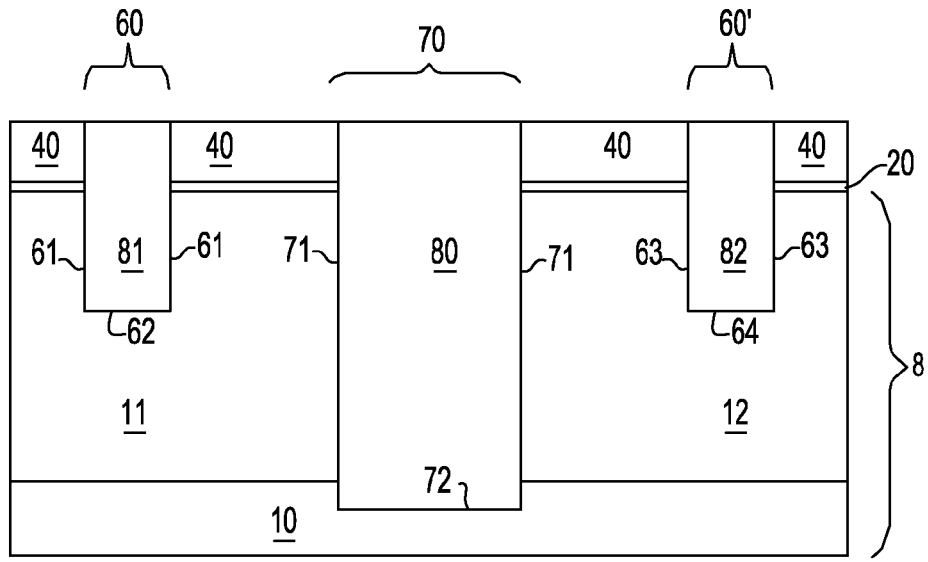

Referring to FIG. 31, a dielectric material is deposited in the inter-well isolation trench, the first intra-well isolation trench, and the second intra-well isolation trench, and planarized, for example, by chemical mechanical polish (CMP) employing the extended pedestal layer as a stopping layer. The dielectric material forms an inter-well isolation trench structure 80 within the inter-well isolation trench, a first intra-well isolation trench structure 81 within the first intra-well isolation trench, and a second intra-well isolation trench structure 82 within the second intra-well isolation trench. The inter-well isolation trench structure 80 is located between the p-well 11 and the n-well 12, the first intra-well isolation trench structure 81 is located within the p-well 11, and the second intra-well isolation trench structure is located within the n-well 12.

The dielectric material may comprise an oxide, a nitride, an oxynitride, or a combination thereof. The dielectric material may comprise a dielectric liner contacting the various trench sidewalls (71, 61, 63) and/or the various trench bottom surfaces (72, 62, 64). For example, the dielectric material may comprise silicon oxide.

Figure 32:
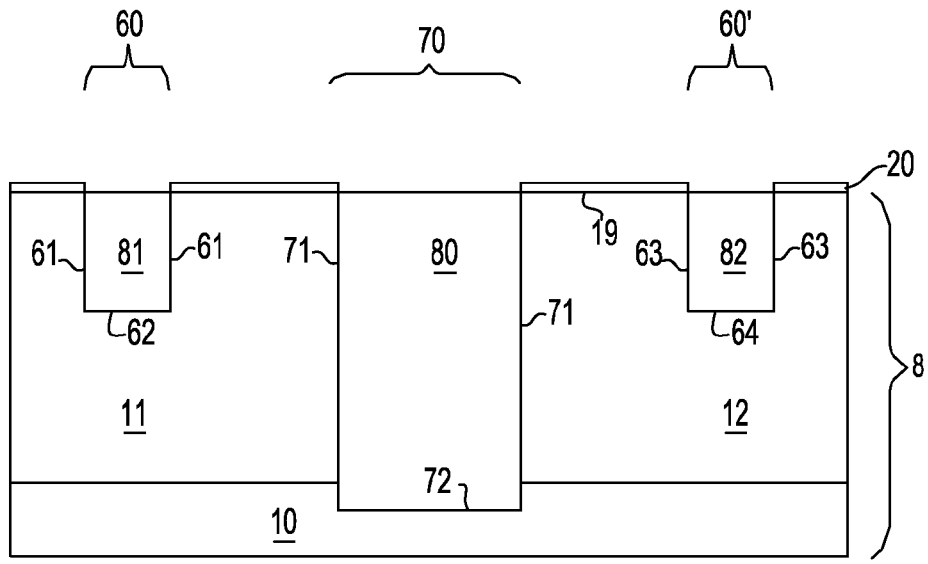

Referring to FIG. 32, the inter-well isolation trench structure 80 and the intra-well isolation trench structures (81, 82) are recessed relative to the extended pedestal layer 40 so that the recessed surfaces are substantially coplanar with the top surface 19 of the semiconductor substrate 8. Subsequently, the extended pedestal layer 40 is removed, for example, by a wet etch.

Figure 33:
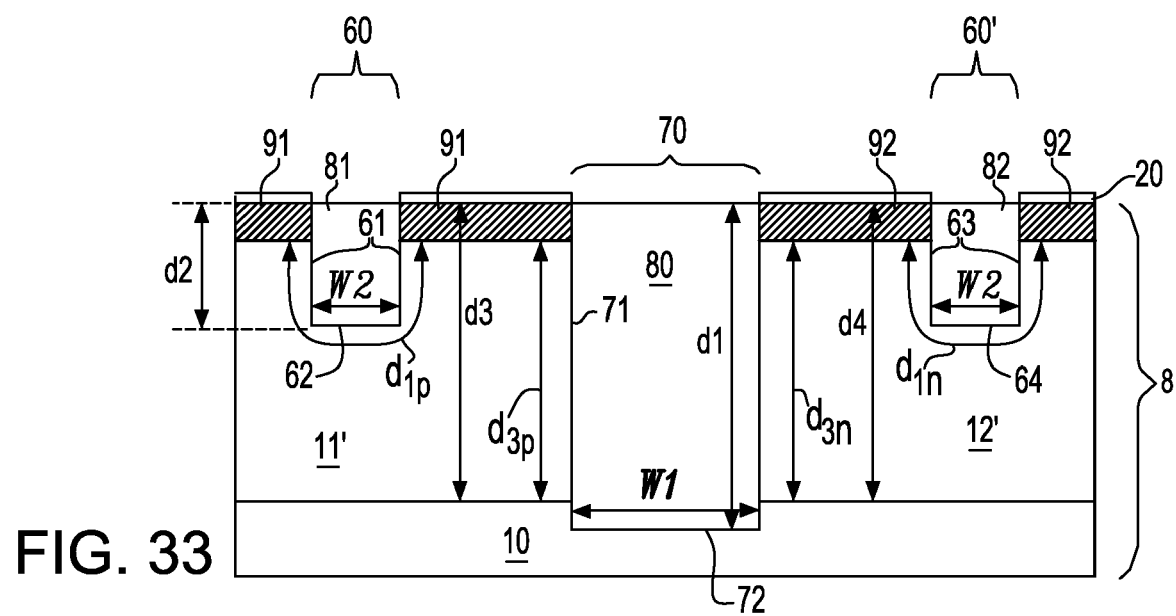

Referring to FIG. 33, a heavily n-doped region 91 and a heavily p-doped region 92 are formed by employing block masks (not shown) and ion implantation processes in a manner similar to the formation of the p-well 11 and the n-well 12. The heavily n-doped region 91 and the heavily p-doped region abut the top surface 19 of the semiconductor substrate 8 and may abut the pair of substantially vertical first trench sidewalls 71. Each of the at least one heavily n-doped region 91 and the at least one heavily p-doped region 92 has a dopant concentration in the range from about $5.0 \times 10^{19}$ atoms/cm$^3$ to about $5.0 \times 10^{21}$ atoms/cm$^3$. The heavily doped regions (91, 92) may be source and drain regions of field effect transistors.

At least one of the third depth d3, which is the depth of the p-well 11, and the fourth depth d4, which is the depth of the n-well, is less than the first depth d1. The second depth d2 is less than both the third depth d3 and the fourth depth d4.

The path of the weakest intra-p-well isolation is represented by a heavily n-doped region to another heavily n-doped region separation distance $d_{1p}$. The path of the weakest intra-n-well isolation is represented by a heavily p-doped region to another heavily p-doped region separation distance $d_{1n}$. For identical dimensions in the first intra-well isolation structure 81 and/or in the second intra-well isolation structure 82, both the prior art and the present invention result in the same heavily n-doped region to another heavily n-doped region separation distance $d_{1p}$ and/or heavily p-doped region to another heavily p-doped region separation distance $d_{1n}$.

The paths of the weakest inter-well isolation in the third exemplary isolation structure are at least as long as a heavily n-doped region to substrate layer separation distance $d_{3p}$ or a heavily p-doped region to substrate layer separation distance $d_{3n}$. The heavily n-doped region to substrate layer separation distance $d_{3p}$ is the same the third depth d3 less the depth of the at least one heavily n-doped region 91. The heavily p-doped region to substrate layer separation distance $d_{3p}$ is the same the third depth d3 less the depth of the at least one heavily p-doped region 92. The paths of the weakest inter-well isolation is longer than the above lower limit estimates since the substrate layer 10 has a low dopant concentration, preferably in the range from about $1.0 \times 10^{15}$ atoms/cm$^3$ to about $1.0 \times 10^{18}$ atoms/cm$^3$.

For example, the depths of the at least one heavily n-doped region 91 and the at least one heavily p-doped region 92 may be about 80 nm, the first depth d1 may be about 480 nm, and the second depth may be about 280 nm. The third depth d3 and the fourth depth d4 may be 400 nm. Utilizing the increased length of the paths of the weakest inter-well isolation, the minimum width of the inter-well isolation area 70 may be reduced as long as the aspect ratio of the inter-well isolation trench is conducive to a fill process by the dielectric material that forms the inter-well trench isolation structure 80. Such reduction in the minimum width of the inter-well isolation area 70 enables design of CMOS circuits with higher device density While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a pair of substantially vertical first trench sidewalls extending from a top surface of a semiconductor substrate to a first depth;
a substantially horizontal first trench bottom surface having a first width and located at said first depth from said top surface and adjoined to said pair of substantially vertical first trench sidewalls;
a first isolation trench structure comprising a dielectric material, wherein said dielectric material laterally abuts a semiconductor material in said semiconductor substrate throughout an entirety of an interface at said pair of substantially vertical first trench sidewalls between said top surface and said substantially horizontal first trench bottom surface at said first depth;
a pair of substantially vertical second trench sidewalls extending from said top surface to a second depth, wherein said first depth is greater than said second depth;
a substantially horizontal second trench bottom surface having a second width and located at said second depth from said top surface and adjoined to said pair of substantially vertical second trench sidewalls, wherein said first width is greater than said second width; and
a p-well and an n-well on opposing sides of the first isolation trench structure, wherein an interface between the p-well and the n-well adjoins said substantially horizontal first trench bottom surface and is self-aligned to the middle of said substantially horizontal first trench bottom surface.

2. The semiconductor structure of claim 1, further comprising:
an inter-well isolation trench structure bounded by said pair of substantially vertical first trench sidewalls and said substantially horizontal first trench bottom surface and comprising an insulator material; and
an intra-well isolation trench structure bounded by said pair of substantially vertical second trench sidewalls and said substantially horizontal second trench bottom surface and comprising said insulator material.

3. The semiconductor structure of claim 2, further comprising:
the p-well having a p-well bottom surface located at a third depth from said top surface and abutting one of said pair of substantially vertical first trench sidewalls;
the n-well having an n-well bottom surface located at a fourth depth from said top surface and abutting the other of said pair of substantially vertical first trench sidewalls; and
a substrate layer adjoining said p-well bottom surface and said n-well bottom surface.

4. The semiconductor structure of claim 3, further comprising:
a pair of substantially vertical third trench sidewalls extending from said top surface to said second depth;
a substantially horizontal third trench bottom surface having a second width and located at said second depth from said top surface and adjoined to said pair of substantially vertical third trench sidewalls; and
another intra-well isolation trench structure bounded by said pair of substantially vertical third trench sidewalls and said substantially horizontal third trench bottom surface and comprising said insulator material, wherein said inter-well isolation trench structure is located within said p-well and said another intra-well isolation trench structure is located within said n-well.

5. The semiconductor structure of claim 3, further comprising:
at least one heavily n-doped region abutting said p-well, said top surface, and one of said pair of substantially vertical first trench sidewalls; and
at least one heavily p-doped region abutting said n-well, said top surface, and the other of said pair of substantially vertical first trench sidewalls, wherein each of said at least one heavily n-doped region and said at least one heavily p-doped region has a dopant concentration in the range from about $5.0 \times 10^{19}$ atoms/cm$^3$ to about $5.0 \times 10^{21}$ atoms/cm$^3$.

6. The semiconductor structure of claim 3, wherein said third depth and said fourth depth are greater than said first depth, said p-well abuts one of said pair of substantially vertical first trench sidewalls, said n-well abuts the other of said pair of substantially vertical first trench sidewalls, and said substrate layer abuts said p-well and said n-well.

7. The semiconductor structure of claim 6, wherein said p-well and said n-well abut said substantially horizontal first trench bottom surface.

8. The semiconductor structure of claim 7, further comprising:
a vertical p-well to substrate layer interface adjoining said substantially horizontal first trench bottom surface at a first location, wherein said first location is separated by a first distance from an edge at which one of said pair of substantially vertical first trench sidewalls adjoins said substantially horizontal first trench bottom surface; and
a vertical n-well to substrate layer interface adjoining said substantially horizontal first trench bottom surface at a second location, wherein said second location is separated by a second distance from another edge at which the other of said pair of substantially vertical first trench sidewalls adjoins said substantially horizontal first trench bottom surface, wherein said first distance is equal to said second distance.

9. The semiconductor structure of claim 3, wherein at least one of said third depth and said fourth depth are less than said first depth, said p-well abuts one of said pair of substantially vertical first trench sidewalls, said n-well abuts the other of said pair of substantially vertical first trench sidewalls, and said substrate layer abuts said p-well, said n-well, said substantially horizontal first trench bottom surface, and at least one of said pair of substantially vertical first trench sidewalls.

10. The semiconductor structure of claim 3, wherein said second depth is less than said first depth, said third depth, and said fourth depth.

11. The semiconductor structure of claim 1, further comprising a second isolation trench structure comprising said dielectric material, wherein said dielectric material laterally abuts said semiconductor material in said semiconductor substrate throughout an entirety of an interface at said pair of substantially vertical second trench sidewalls between said top surface and said substantially horizontal second trench bottom surface at said second depth.

* * * * *